United States Patent
Lu et al.

(10) Patent No.: US 10,930,769 B2
(45) Date of Patent: Feb. 23, 2021

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Chun-Chieh Lu, Taipei (TW); Cheng-Yi Peng, Taipei (TW); Chien-Hsing Lee, New Taipei (TW); Ling-Yen Yeh, Hsinchu (TW); Chih-Sheng Chang, Hsinchu (TW); Carlos H. Diaz, Mountain View, CA (US)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/200,691

(22) Filed: Nov. 27, 2018

(65) Prior Publication Data

US 2019/0131426 A1 May 2, 2019

Related U.S. Application Data

(62) Division of application No. 15/798,273, filed on Oct. 30, 2017, now Pat. No. 10,741,678.

(51) Int. Cl.
*H01L 29/66* (2006.01)
*H01L 21/28* (2006.01)
(Continued)

(52) U.S. Cl.
CPC .... *H01L 29/6684* (2013.01); *H01L 21/28088* (2013.01); *H01L 29/40111* (2019.08);
(Continued)

(58) Field of Classification Search
CPC combination set(s) only.
See application file for complete search history.

(56) References Cited

U.S. PATENT DOCUMENTS 6,096,592 A 8/2000 Cho
9,608,110 B2 3/2017 Baars et al.
(Continued)

FOREIGN PATENT DOCUMENTS

DE 102014221371 A1 4/2016
DE 102017110434 A1 5/2018
(Continued)

OTHER PUBLICATIONS

Final Office Action issued in related U.S. Appl. No. 15/798,273, dated Apr. 16, 2019.
(Continued)

*Primary Examiner* — Moin M Rahman
(74) *Attorney, Agent, or Firm* — McDermott Will & Emery LLP

(57) ABSTRACT

In a method of manufacturing a negative capacitance structure, a dielectric layer is formed over a substrate. A first metallic layer is formed over the dielectric layer. After the first metallic layer is formed, an annealing operation is performed, followed by a cooling operation. A second metallic layer is formed. After the cooling operation, the dielectric layer becomes a ferroelectric dielectric layer including an orthorhombic crystal phase.

16 Claims, 22 Drawing Sheets

(51) Int. Cl.
*H01L 29/94* (2006.01)
*H01L 29/51* (2006.01)
*H01L 29/78* (2006.01)

(52) U.S. Cl.
CPC ...... *H01L 29/516* (2013.01); *H01L 29/66545* (2013.01); *H01L 29/785* (2013.01); *H01L 29/94* (2013.01)

(56) References Cited

U.S. PATENT DOCUMENTS

| | | | |
|---|---|---|---|
| 9,793,397 | B1 | 10/2017 | Ando et al. |
| 2001/0011738 | A1 | 8/2001 | Hayashi et al. |
| 2003/0162394 | A1 | 8/2003 | Takemura |
| 2005/0151184 | A1* | 7/2005 | Lee .................. H01L 21/28185 257/314 |
| 2006/0094192 | A1* | 5/2006 | Yang .................. H01L 21/3141 438/287 |
| 2007/0004049 | A1 | 1/2007 | Nasu et al. |
| 2010/0200946 | A1 | 8/2010 | Hautala |
| 2011/0215320 | A1 | 9/2011 | Chan et al. |
| 2013/0026579 | A1 | 1/2013 | Lu et al. |
| 2013/0126979 | A1* | 5/2013 | Chern ................. H01L 23/5256 257/379 |
| 2014/0124876 | A1 | 5/2014 | Kim et al. |
| 2014/0363964 | A1 | 12/2014 | Breil et al. |
| 2015/0048458 | A1 | 2/2015 | Zhu et al. |
| 2015/0076437 | A1 | 3/2015 | Tao et al. |
| 2015/0206951 | A1* | 7/2015 | Lin .................... H01L 21/2686 257/411 |
| 2015/0221743 | A1 | 8/2015 | Ho et al. |
| 2016/0111549 | A1 | 4/2016 | Baars et al. |
| 2016/0308021 | A1 | 10/2016 | Lee |
| 2016/0308070 | A1* | 10/2016 | Chang .................. H01L 29/792 |
| 2016/0359109 | A1 | 12/2016 | Kamimuta et al. |
| 2017/0358684 | A1 | 12/2017 | Chen et al. |
| 2018/0108745 | A1* | 4/2018 | Li .................... H01L 21/02304 |
| 2018/0151745 | A1 | 5/2018 | Chang et al. |
| 2018/0269057 | A1* | 9/2018 | Lei .................... C23C 16/45553 |
| 2019/0067488 | A1 | 2/2019 | Tsai et al. |

FOREIGN PATENT DOCUMENTS

| | | | |
|---|---|---|---|
| KR | 10-0269314 | B1 | 10/2000 |
| KR | 10-2001-0108086 | A | 12/2001 |
| KR | 2003-0071586 | A | 9/2003 |
| KR | 10-2010-0029952 | A | 3/2010 |
| KR | 2014-0004855 | A | 1/2014 |
| KR | 10-2016-0041985 | A | 4/2016 |

OTHER PUBLICATIONS

Zhou, Jiuren, et a;., "Ferroelectric HfZrOx Ge and GeSn PMOSFETs with Sub-60 mV/ decade Subthreshold Swing, Negligible Hysteresis, and Improved Ids", Electron Devices Meeting (IEDM), 2016 IEEE International.

Li, Kai-Shin, et al., "Sub-60m V-Swing Negative-Capacitance FinFET without Hysteresis", Electron Devices Meeting (IEDM), 2015 IEEE International.

Lee, M. H., et al., "Physical Thickness 1.x nm Ferroelectric HfZrOx Negative Capacitance FETs", Electron Devices Meeting (IEDM), 2016 IEEE International.

Non-final Office Action issued in related U.S. Appl. No. 15/798,273, dated Dec. 13, 2019.

* cited by examiner

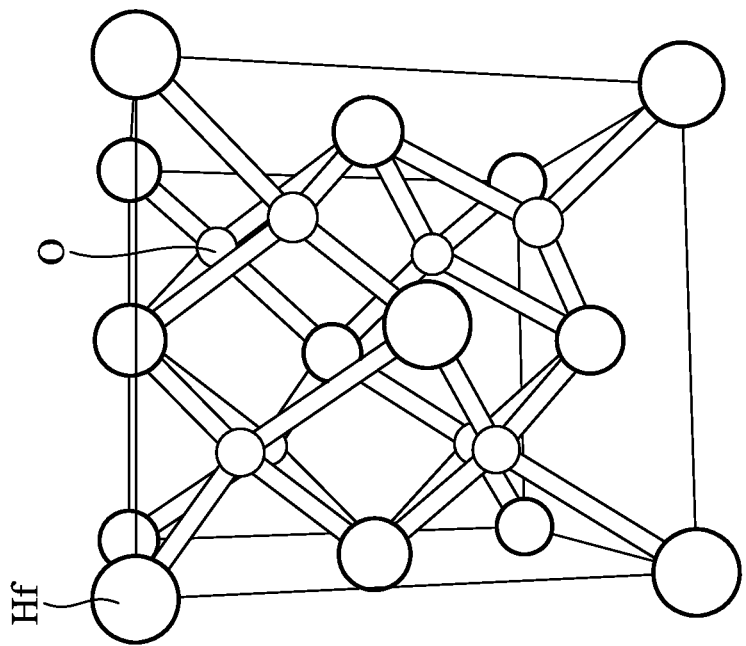
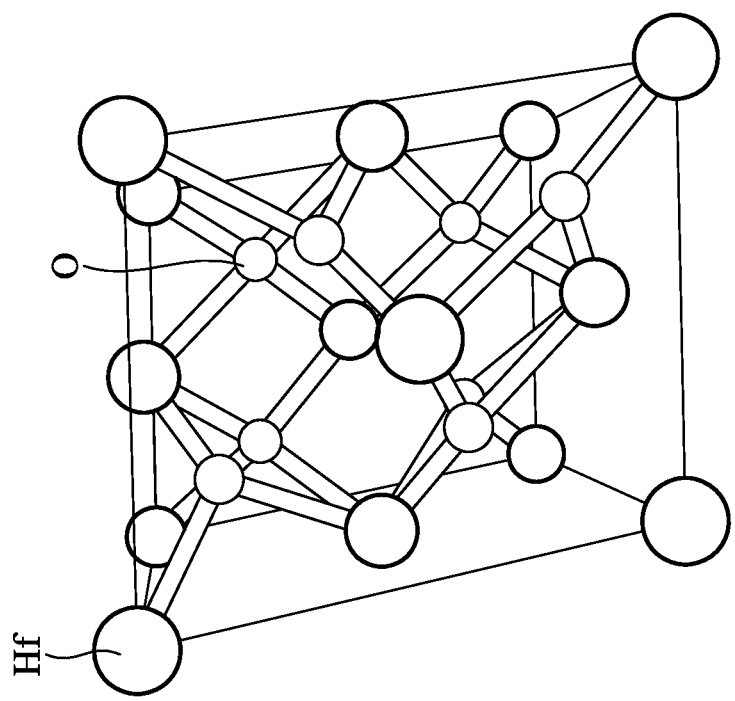
FIG. 3D

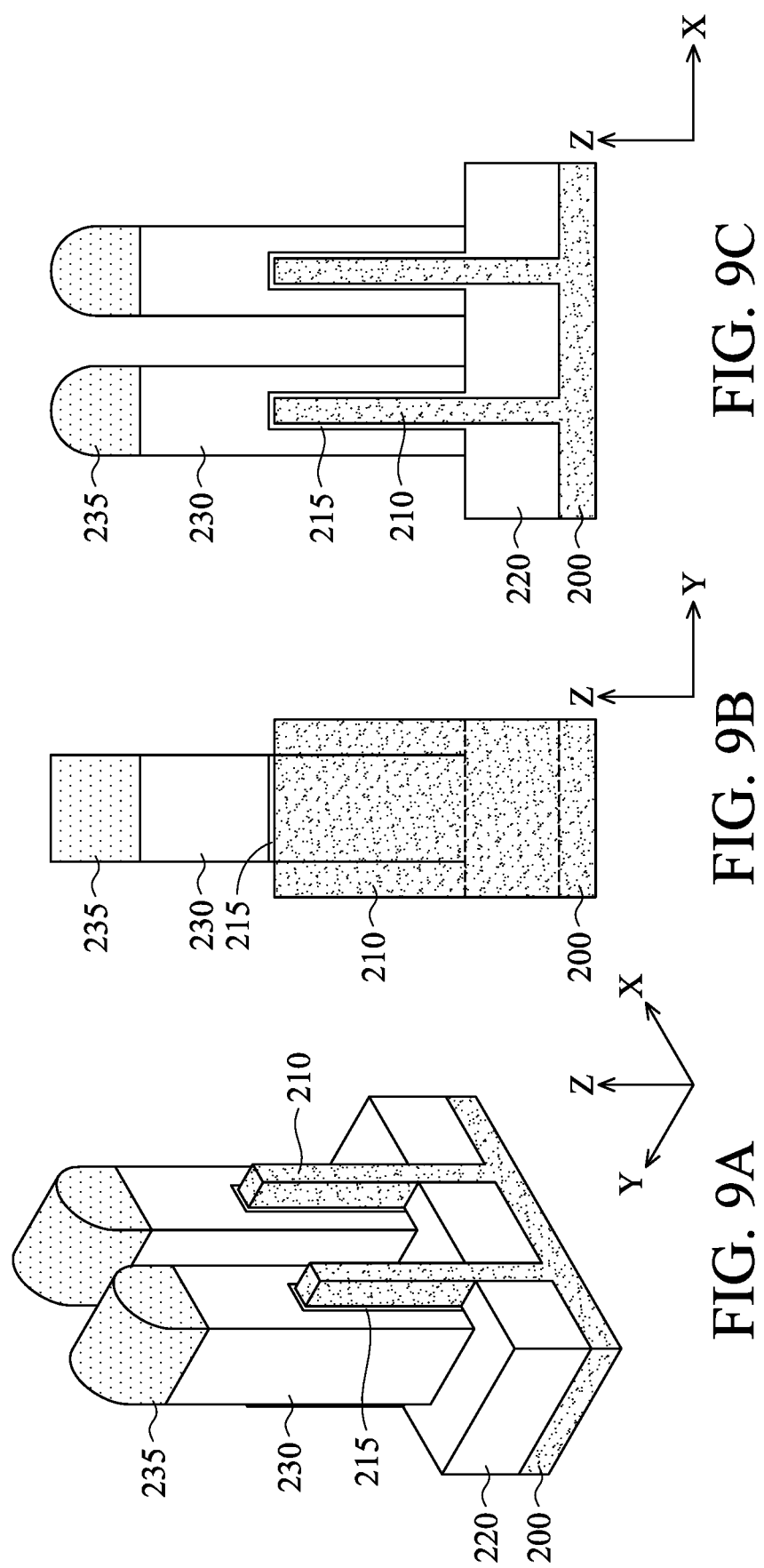

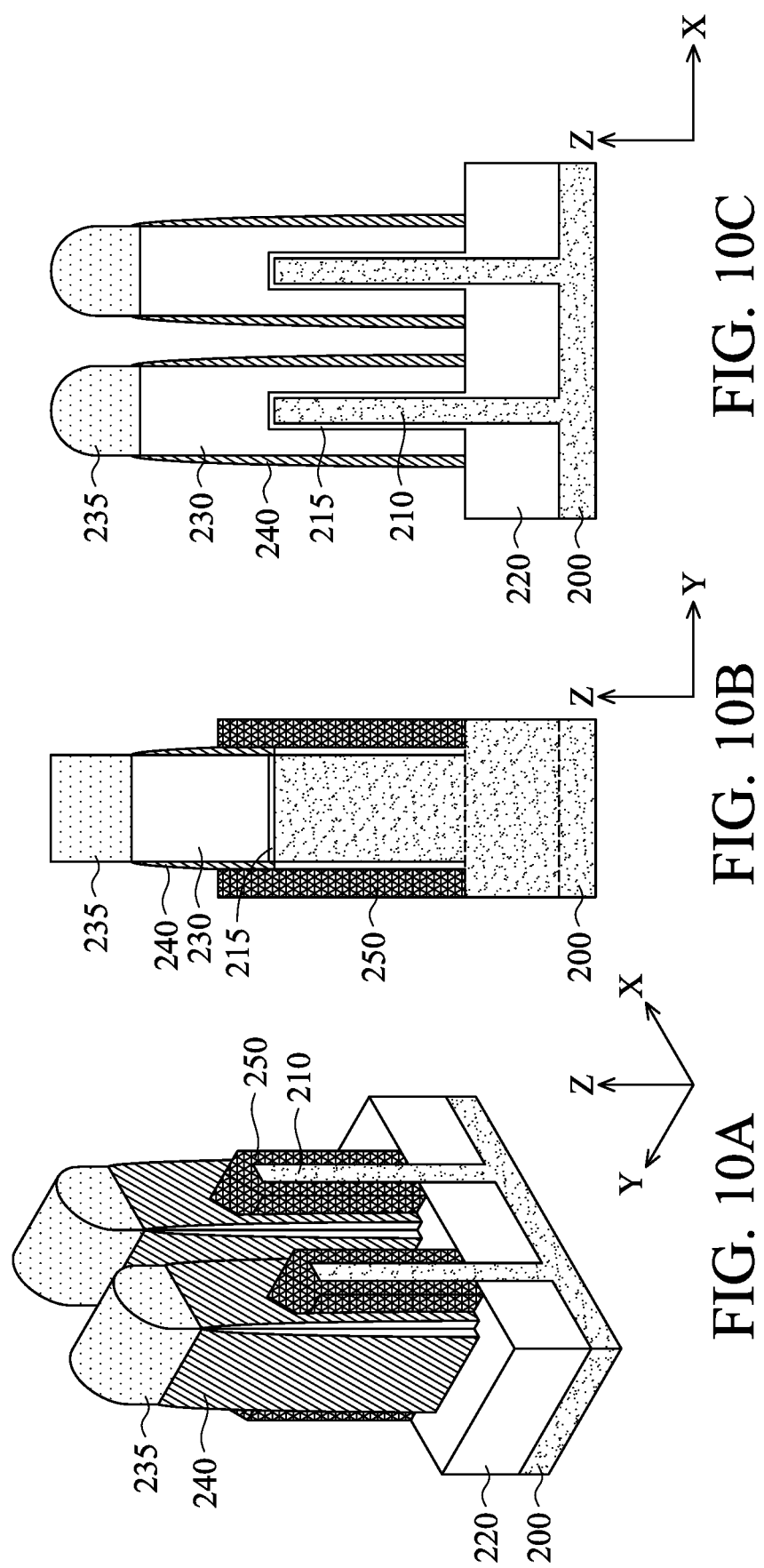

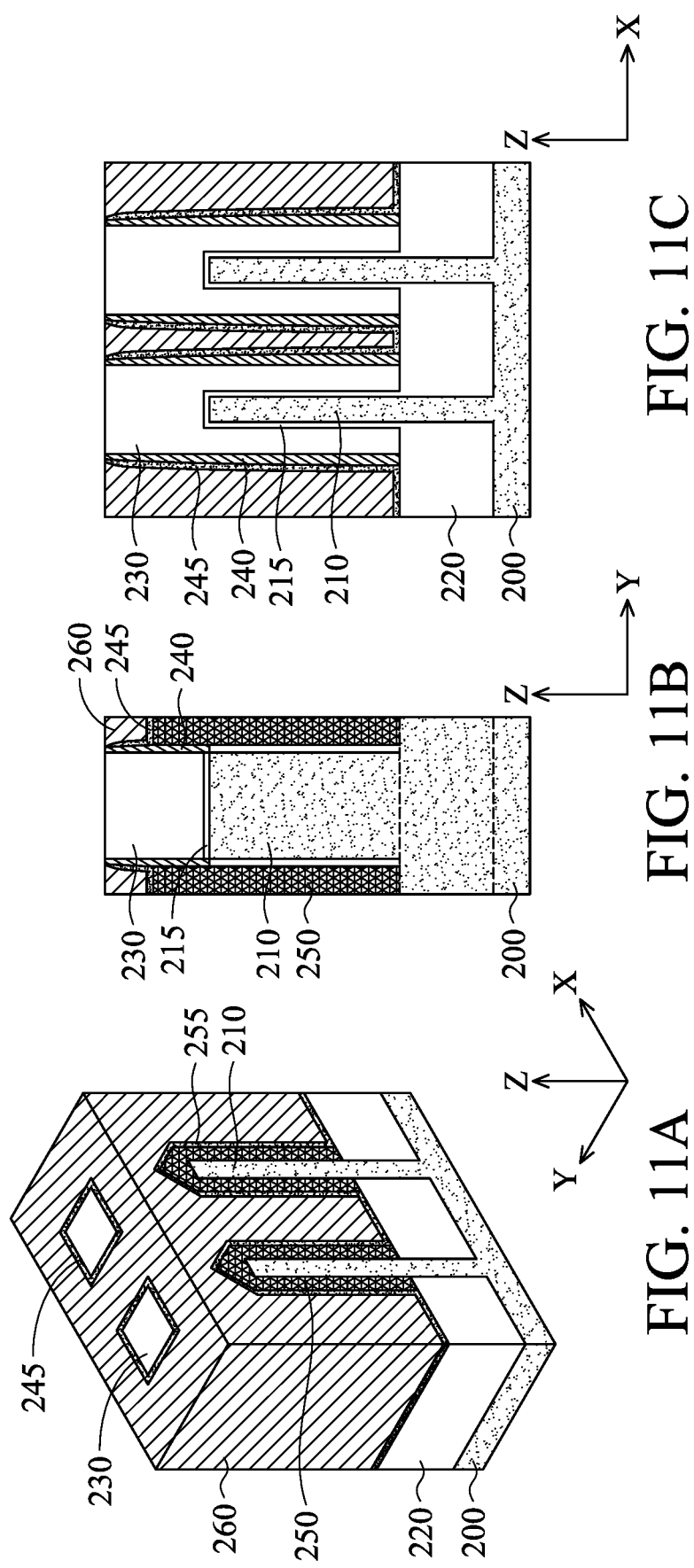

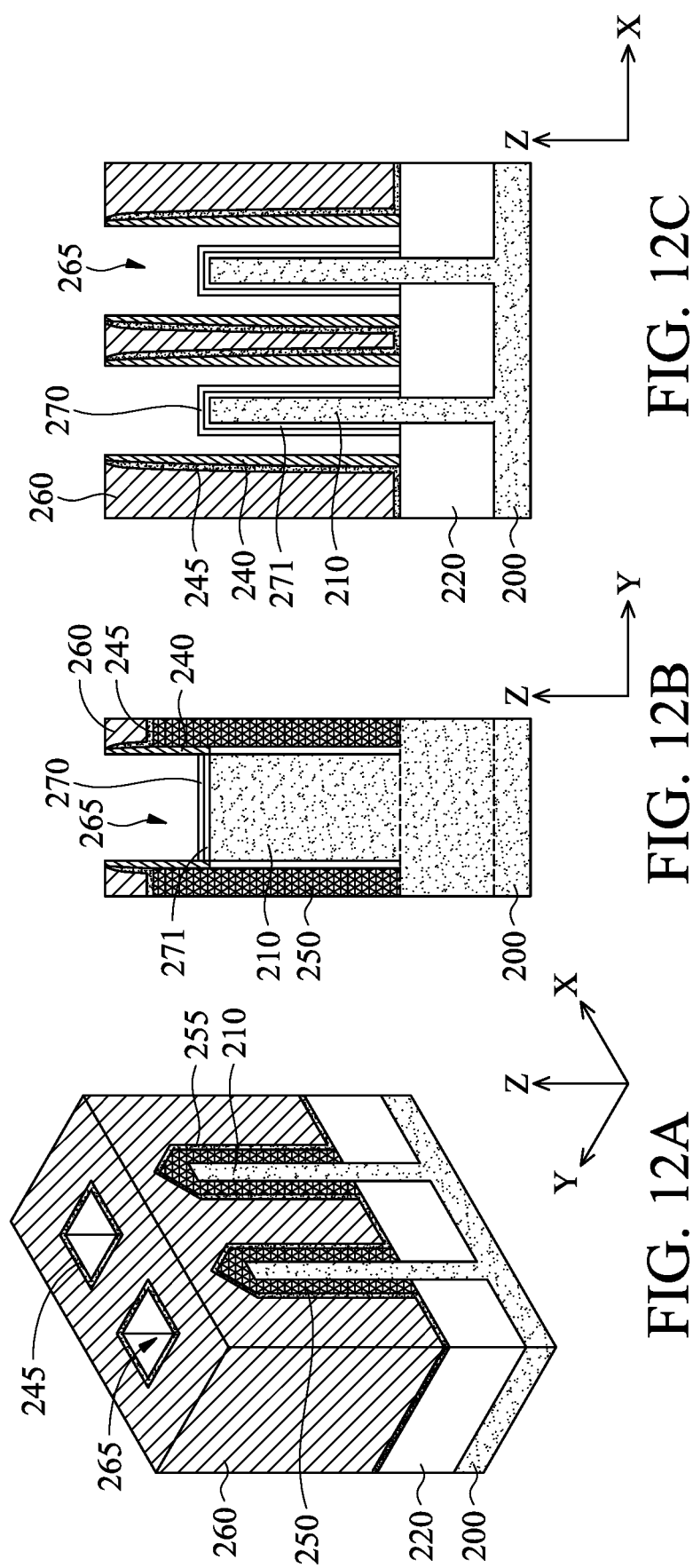

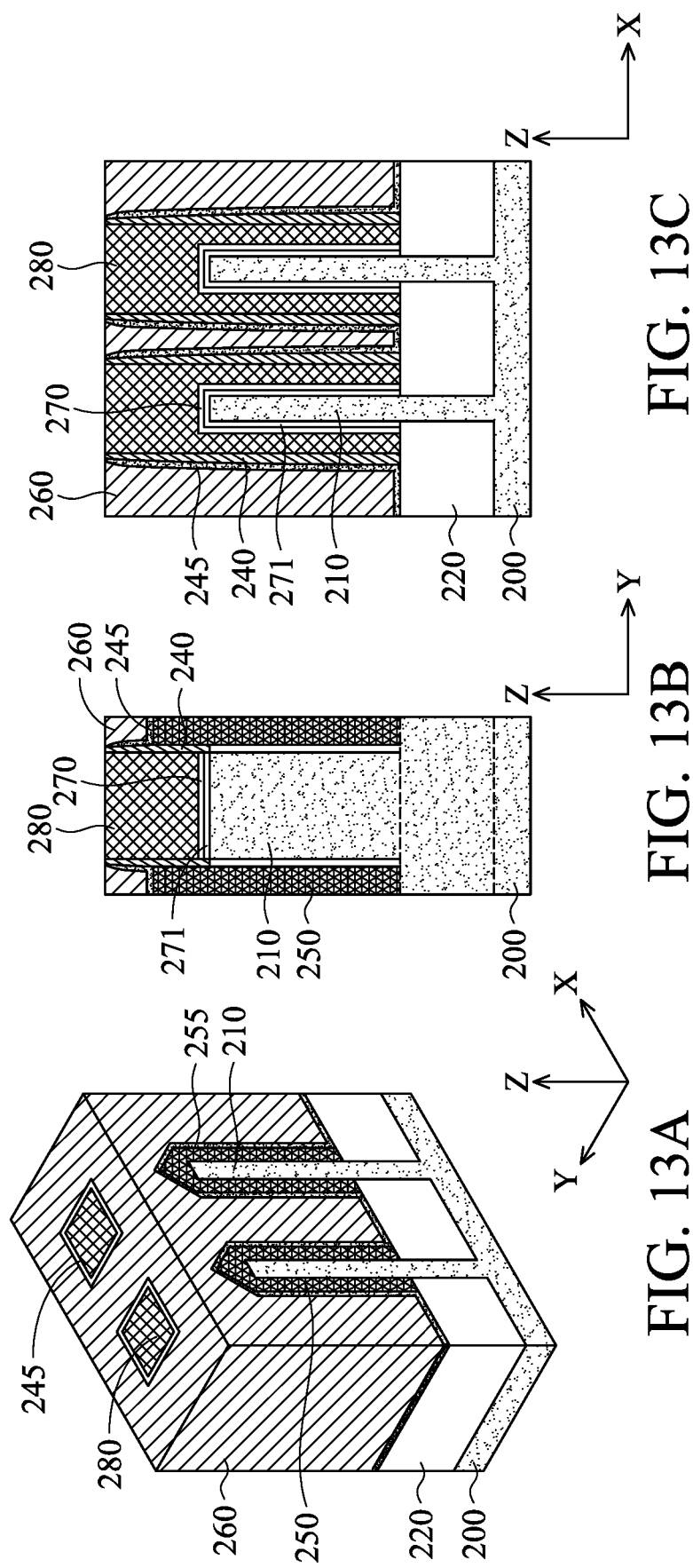

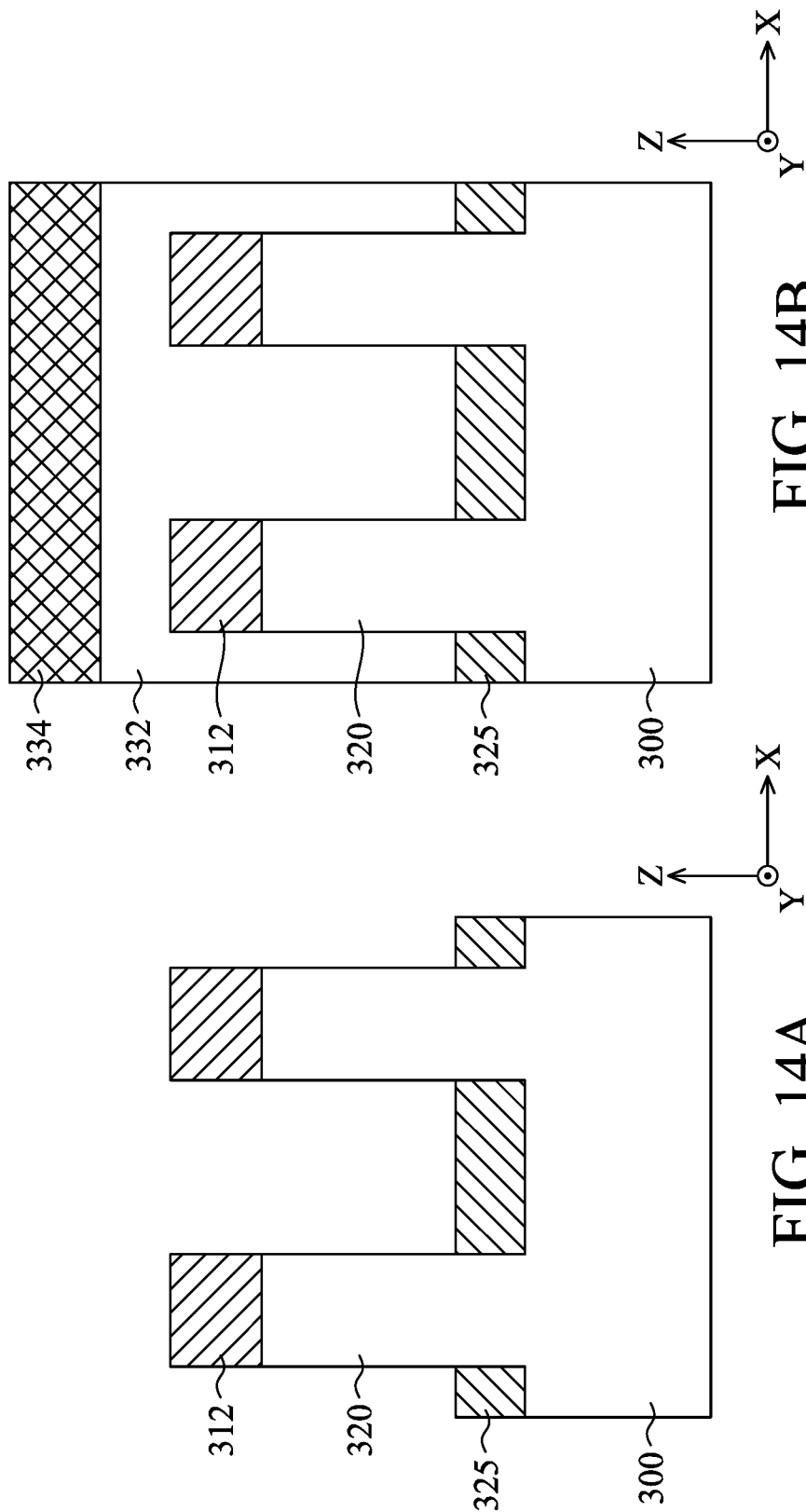

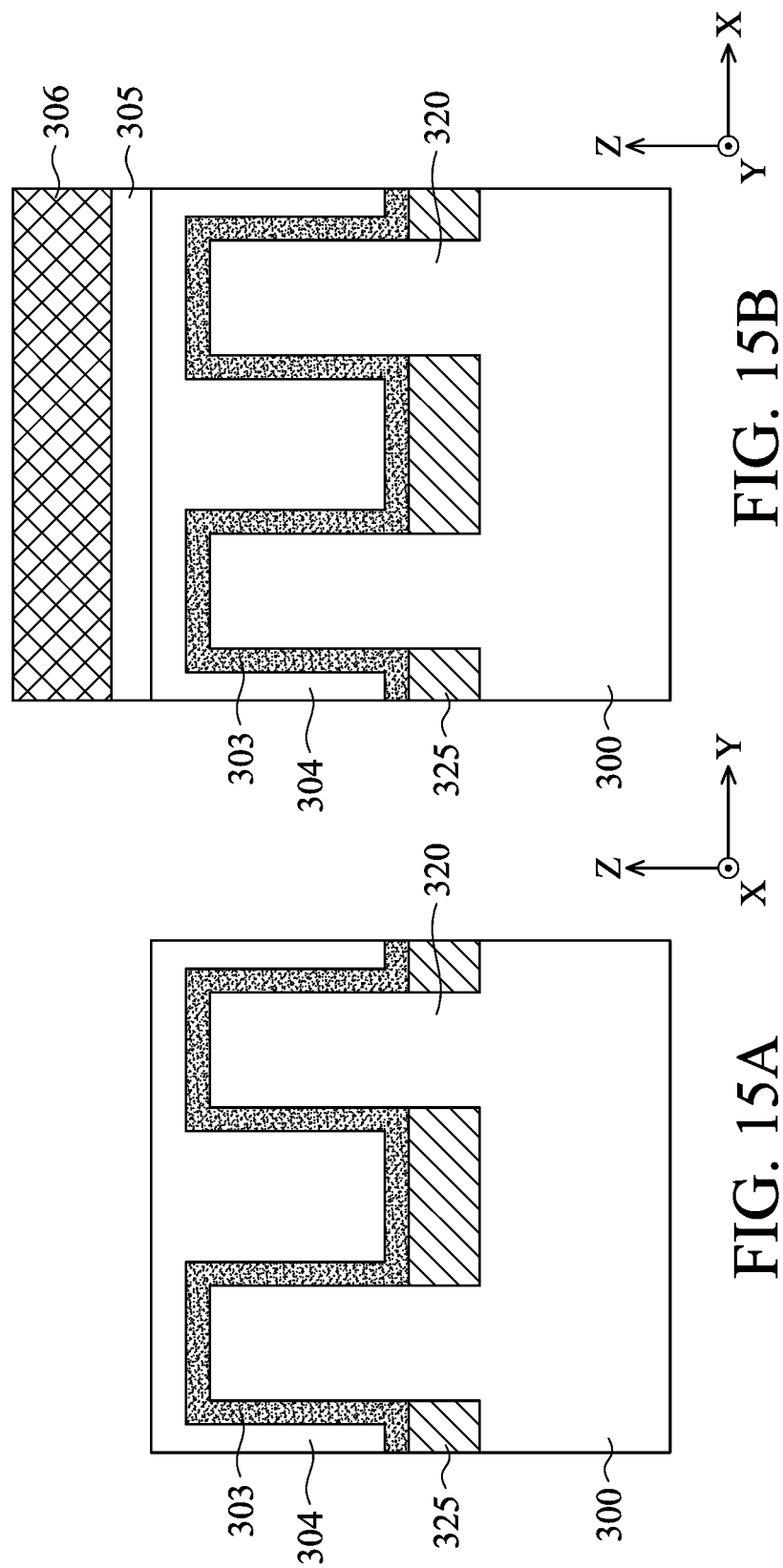

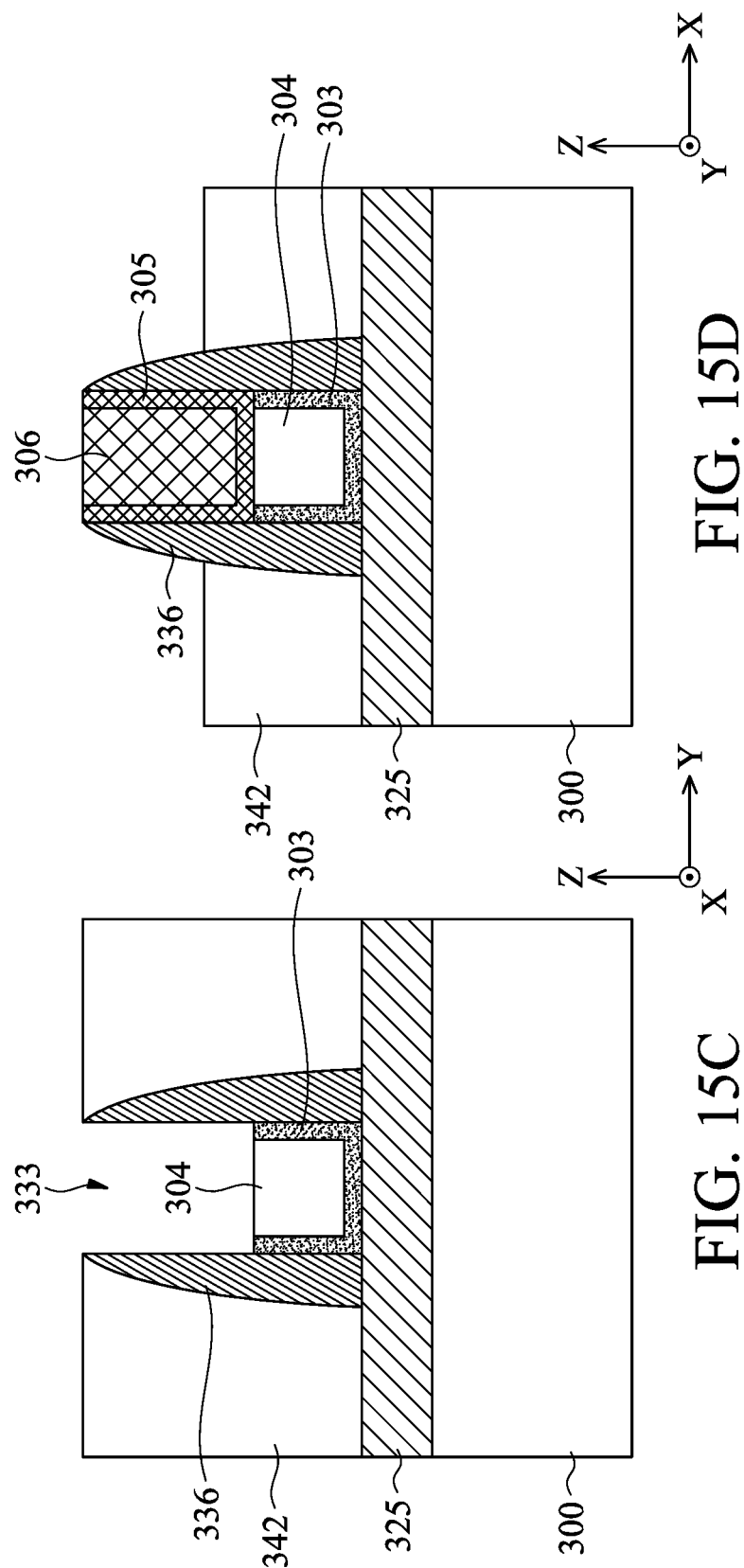

US 10,930,769 B2

SEMICONDUCTOR DEVICE AND MANUFACTURING METHOD THEREOF

CROSS-REFERENCE TO RELATED APPLICATIONS

This application is a divisional application of application Ser. No. 15/798,273 filed on Oct. 30, 2017, the entire disclosures of which are incorporated herein by reference.

TECHNICAL FIELD

The disclosure relates to semiconductor integrated circuits, and more particularly to semiconductor devices including negative capacitance field effect transistors (NC FETs).

BACKGROUND

The subthreshold swing is a feature of a transistor's current-voltage characteristic. In the subthreshold region the drain current behavior is similar to the exponentially increasing current of a forward biased diode. A plot of logarithmic drain current versus gate voltage with drain, source, and bulk voltages fixed will exhibit approximately logarithmic linear behavior in this metal-oxide-semiconductor (MOS) FET operating region. To improve the subthreshold properties, a negative capacitance field effect transistor (NC FET) using a ferroelectric material has been proposed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A, 3B, 3C and 3D show various atomic structures of $HfO_2$.

FIGS. 9A, 9B and 9C show various stages of manufacturing operations for an NC FET in accordance with an embodiment of the present disclosure.

FIGS. 10A, 10B and 10C show various stages of manufacturing operations for an NC FET in accordance with an embodiment of the present disclosure.

FIGS. 11A, 11B and 11C show various stages of manufacturing operations for an NC FET in accordance with an embodiment of the present disclosure.

FIGS. 12A, 12B and 12C show various stages of manufacturing operations for an NC FET in accordance with an embodiment of the present disclosure.

FIGS. 13A, 13B and 13C show various stages of manufacturing operations for an NC FET in accordance with an embodiment of the present disclosure.

FIGS. 14A, 14B, 14C and 14D show manufacturing operations for an NC FET in accordance with another embodiment of the present disclosure.

FIGS. 15A, 15B, 15C and 15D show manufacturing operations for an NC FET in accordance with an embodiment of the present disclosure.

DETAILED DESCRIPTION

Figure 1A:
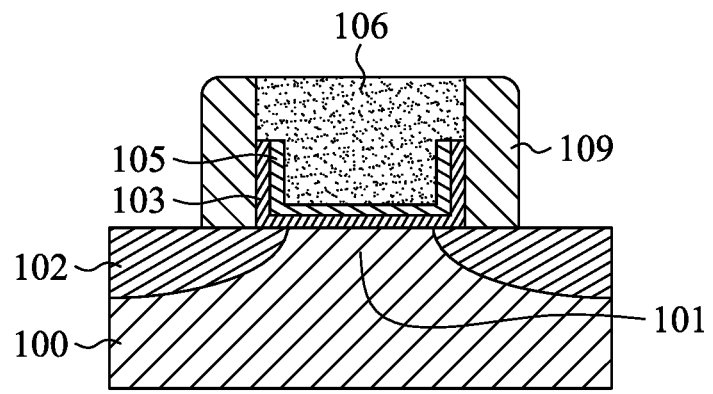
FIGS. 1A and 1B shows cross sectional views of metal-insulator-semiconductor (MIS) FET-type NC FETs.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed.

To lower subthreshold swing (S.S.) of a field effect transistor (FET), a negative-capacitance (NC) technology, such as integrating ferroelectric (FE) materials, provides a feasible solution to lower $V_{DD}$ (power supply) significantly, and achieves an FET having a steep S.S. for low power operation.

In an NC FET, a capacitor (e.g., a ferroelectric (FE) capacitor) having a negative capacitance is connected to a gate of a MOS FET in series. The ferroelectric negative capacitor can be a separate capacitor connected by a conductive layer (e.g., wire/contact) to the gate of the MOS FET, in some embodiments. In other embodiments, one of the electrodes of the negative capacitor is a gate electrode of the MOS FET. In such a case, the negative capacitor is formed within sidewall spacers of the MOS FET.

In conventional devices, high-K gate materials, such as $HfO_2$, are usually an amorphous layer. However, the un-doped $HfO_2$ is amorphous and paraelectric, which does not show a negative-capacitance effect. Ferroelectric materials having Perovskite structure, such as PZT or $BaTiO_3$, have excellent FE characteristics. However, these materials still pose difficulties because formation of these materials is not fully compatible with silicon-based semiconductors, and the ferroelectric properties degrade with reducing the thickness thereof due to a size effect.

In the present disclosure, a doped $HfO_2$ layer having an orthorhombic crystal phase, which shows a ferroelectric property, and its production methods are provided.

Figure 1B:
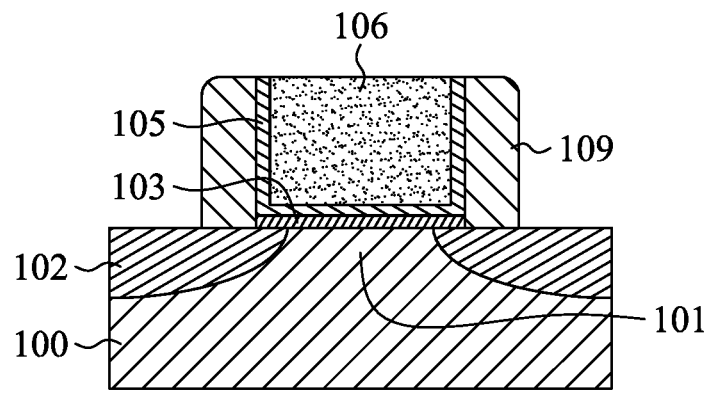
Figure 1C:
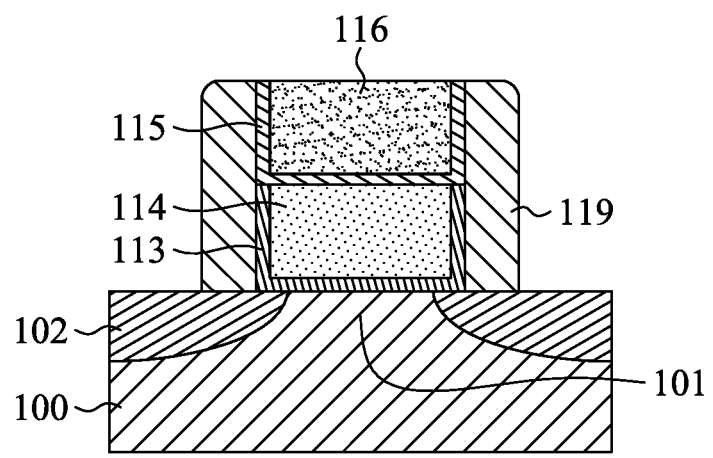
FIG. 1C shows a cross sectional view of a metal-insulator-metal-insulator-semiconductor (MIMIS) FET-type NC FET.

FIGS. 1A and 1B show cross sectional views of metal-insulator-semiconductor (MIS) FET-type NC FETs, and FIG. 1B shows a cross sectional view of a metal-insulator-metal-insulator-semiconductor (MIMIS) FET-type NC FET. Although FIGS. 1A-1C show NC FETs of a planar MOS transistor structure, fin FETs and/or gate-all-around FETs can be employed.

As shown in FIG. 1A, an MIS NC FET includes a substrate 100, a channel 101 and source and drain 102. The source and drain 102 are appropriately doped with impurities. Further, the source and drain and the channel (active regions) are surrounded by an isolation insulating layer (not shown), such as shallow trench isolation (STI), made of, for example, silicon oxide.

An interfacial layer 103 is formed over the channel layer 101, in some embodiments. The interfacial layer 103 is made of silicon oxide having thickness in a range from about 0.5 nm to about 1.5 nm in some embodiments.

A ferroelectric dielectric layer 105 is disposed over the interfacial layer 103. The ferroelectric dielectric layer 105 includes $HfO_2$ doped with one or more elements selected from the group consisting of Si, Zr, Al, La, Y, Gd and Sr. In some embodiments, the ferroelectric dielectric layer 105 includes $HfO_2$ doped with Si and/or Zr. In certain embodiments, the ferroelectric dielectric 105 layer includes $HfO_2$ doped with Si in an amount of 2-6 mol % or $HfZrO_2$ (Hf:Zr=1:1). In the present disclosure, the ferroelectric dielectric layer 105 includes an orthorhombic crystal phase. The orthorhombic crystal of the ferroelectric dielectric layer 105 is polycrystalline in some embodiments. The thickness of the ferroelectric dielectric layer 105 is in a range from about 1.0 nm to about 5 nm in some embodiments, and may be formed by a suitable process such as ALD or CVD.

A gate electrode layer 106 is disposed over the ferroelectric dielectric layer 105. The gate electrode layer 106 includes one or more metallic layers. In some embodiments, the gate electrode layer 106 includes a first conductive layer (a capping layer) disposed on the ferroelectric dielectric layer 105, a second layer (a barrier layer) disposed on the first conductive layer, a third conductive layer (a work function adjustment layer) disposed on the second conductive layer, a fourth conductive layer (a glue layer) disposed on the third conductive layer and/or a fifth conductive layer (a main gate metal layer) disposed on the fourth conductive layer.

The capping layer includes a TiN based material, such as TiN and TiN doped with one or more additional elements. In some embodiments, the TiN layer is doped with Si. The barrier layer includes TaN in some embodiments.

The work function adjustment layer includes one or more layers of conductive material, such as a single layer of TiN, TaN, TaAlC, TiC, TaC, Co, Al, TiAl, HfTi, TiSi, TaSi or TiAlC, or a multilayer of two or more of these materials. For the n-channel FinFET, one or more of TaN, TaAlC, TiN, TiC, Co, TiAl, HfTi, TiSi and TaSi is used as the work function adjustment layer, and for the p-channel FinFET, one or more of TiAlC, Al, TiAl, TaN, TaAlC, TiN, TiC and Co is used as the work function adjustment layer.

The glue layer includes Ti, TiN and/or TaN in some embodiments. The main gate metal layer includes a metal selected from a group of W, Cu, Ti, Al and Co.

Further, sidewall spacers 109 are formed on opposing side faces of the gate structure as shown in FIG. 1A. The sidewall spacers 109 include one or more layers of insulating material, such as silicon oxide, silicon nitride and silicon oxynitride.

FIG. 1B shows a cross sectional views of a metal-insulator-semiconductor (MIS) FET-type NC FET in accordance with another embodiment. In FIG. 1B, the interfacial layer 103 is has a flat shape, and the ferroelectric dielectric layer 105 is conformally formed in the gate space and has a height substantially equal to the height of the gate electrode layer 106.

In FIG. 1C, similar to FIGS. 1A and/or 1B, a channel 101 and source and drain 102 are formed on a substrate 100. A first gate dielectric layer 113 is disposed over the channel 101. The first gate dielectric layer 113 includes one or more high-k dielectric layers (e.g., having a dielectric constant greater than 3.9) in some embodiments. For example, the one or more gate dielectric layers may include one or more layers of a metal oxide or a silicate of Hf, Al, Zr, combinations thereof, and multi-layers thereof. Other suitable materials include La, Mg, Ba, Ti, Pb, Zr, in the form of metal oxides, metal alloy oxides, and combinations thereof. Exemplary materials include $MgO_x$, $SiN(Si_3N_4)$, $Al_2O_3$, $La_2O_3$, $Ta_2O_3$, $Y_2O_3$, $HfO_2$, $ZrO_2$, $GeO_2$, $Hf_xZr_{1-x}O_2$, $Ga_2O_3$, $Gd_2O_3$, $TaSiO_2$, $TiO_2$, $HfSiON$, $YGe_xO_y$, $YSi_xO_y$, and $LaAlO_3$, and the like. In certain embodiments, $HfO_2$, $ZrO_2$ and/or $Hf_xZr_{1-x}O_2$ is used. The formation methods of first gate dielectric layer 113 include molecular-beam deposition (MBD), atomic layer deposition (ALD), physical vapor deposition (PVD), chemical vapor deposition (CVD), and the like. In some embodiments, the first gate dielectric layer 113 has a thickness of about 1.0 nm to about 5.0 nm.

In some embodiments, an interfacial layer (not shown) may be formed over the channel 101 prior to forming the first gate dielectric layer 113, and the first gate dielectric layer 113 is formed over the interfacial layer.

A first gate electrode 114 as an internal electrode is disposed on the first gate dielectric layer 113. The first gate electrode 114 may be one or more metals, such as W, Cu, Ti, Ag, Al, TiAl, TiAlN, TaC, TaCN, TaSiN, Mn, Co, Pd, Ni, Re, Ir, Ru, Pt, and Zr. In some embodiments, the first gate electrode 114 includes one or more of TiN, WN, TaN, and Ru. Metal alloys such as Ti—Al, Ru—Ta, Ru—Zr, Pt—Ti, Co—Ni and Ni—Ta may be used and/or metal nitrides, such as $WN_x$, $TiN_x$, $MoN_x$, $TaN_x$, and $TaSi_xN_y$ may also be used. In some embodiments, at least one of W, Ti, Ta, TaN and TiN is used as the first gate electrode 114. In some embodiments, the first gate electrode 114 includes a work function adjustment layer.

A ferroelectric dielectric layer 115 is formed on the first gate electrode 114. The ferroelectric dielectric layer 115 includes $HfO_2$ doped with one or more elements selected from the group consisting of Si, Zr, Al, La, Y, Gd and Sr. In some embodiments, the ferroelectric dielectric layer 115 includes $HfO_2$ doped with Si and/or Zr. In certain embodiments, the ferroelectric dielectric 115 layer includes $HfO_2$ doped with Si in an amount of 2-6 mol % or $HfZrO_2$ (Hf:Zr=1:1). In the present disclosure, the ferroelectric dielectric layer 115 includes an orthorhombic crystal phase. The orthorhombic crystal of the ferroelectric dielectric layer 115 is polycrystalline in some embodiments. The thickness of the ferroelectric dielectric layer 115 is in a range from about 1.0 nm to about 5 nm in some embodiments, and may be formed by a suitable process such as ALD or CVD.

Further, a second gate electrode 116 as an external gate is disposed on the ferroelectric dielectric layer 115. The second gate electrode 116 may be a metal selected from a group of W, Cu, Ti, Ag, Al, TiAl, TiAlN, TaC, TaCN, TaSiN, Mn, Co, Pd, Ni, Re, Ir, Ru, Pt, and Zr. The second gate electrode 116 is made of the same material as or different material from the first gate electrode 114. Further, sidewall spacers 119 are formed on opposing side faces of the gate structure as shown in FIG. 1C. The sidewall spacers 119 include one or more layers of insulating material, such as silicon oxide, silicon nitride and silicon oxynitride.

As shown in FIGS. 1A-1C, the ferroelectric dielectric layers 105 and 115 and the first gate dielectric layer 113 have a "U-shape" in the cross section, having a thin center portion and thick side portions in the vertical direction.

FIGS. 2A, 2B, 2C and 2D show various stages of manufacturing operations for a negative capacitance structure in accordance with an embodiment of the present disclosure. It is understood that additional operations can be provided before, during, and after the processes shown by FIGS. 2A-2D, and some of the operations described below can be replaced or eliminated, for additional embodiments of the method. The order of the operations/processes may be interchangeable. Material, configuration, dimensions and/or processes the same as or similar to the foregoing embodiments described with FIGS. 1A-1C may be employed in the following embodiments, and detailed explanation thereof may be omitted.

Figure 2A:
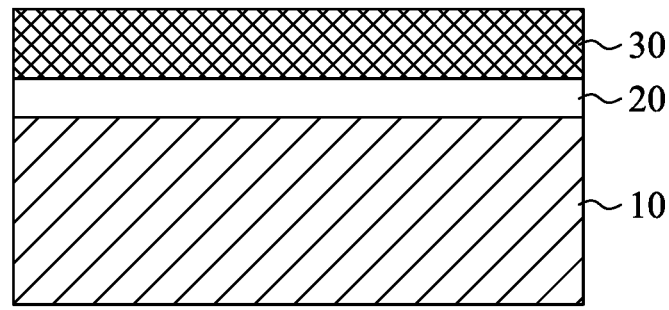
FIGS. 2A, 2B, 2C and 2D show various stages of manufacturing operations for a negative capacitance structure in accordance with an embodiment of the present disclosure.

As shown in FIG. 2A, an interfacial layer 20 is formed on a substrate 10. In some embodiments, the substrate 10 is made of a suitable elemental semiconductor, such as silicon, diamond or germanium; a suitable alloy or compound semiconductor, such as Group-IV compound semiconductors (silicon germanium (SiGe), silicon carbide (SiC), silicon germanium carbide (SiGeC), GeSn, SiSn, SiGeSn), Group III-V compound semiconductors (e.g., gallium arsenide (GaAs), indium gallium arsenide (InGaAs), indium arsenide (InAs), indium phosphide (InP), indium antimonide (InSb), gallium arsenic phosphide (GaAsP), or gallium indium phosphide (GaInP)), or the like. Further, the substrate 10 may include an epitaxial layer (epi-layer), which may be strained for performance enhancement, and/or may include a silicon-on-insulator (SOI) structure.

In some embodiments, the interfacial layer 20 is a silicon oxide, which may be formed by chemical reactions. For example, a chemical silicon oxide may be formed using deionized water+ozone ($DIO_3$), $NH_4OH+H_2O_2+H_2O$ (APM), or other methods. Other embodiments may utilize a different material or processes for the interfacial layer. In some embodiments, the interfacial layer 20 has a thickness of about 0.5 nm to about 1.5 nm.

Then, a dielectric layer 30 is formed over the interfacial layer 20. The dielectric layer 30 includes $HfO_2$ doped with one or more elements selected from the group consisting of Si, Zr, Al, La, Y, Gd and Sr.

The formation methods of the dielectric layer 30 include molecular-beam deposition (MBD), atomic layer deposition (ALD), physical vapor deposition (PVD), chemical vapor deposition (CVD), and the like. In some embodiments, $HfO_2$ doped with Zr can be formed by ALD using $HfCl_4$ and $H_2O$ as a first precursor and $ZrCl_4$ and $H_2O$ as a second precursor at a temperature in a range from about 200° C. to 400° C. In a case of $HfO_2$ doped with Si, $SiH_4$, $Si_2H_6$, and/or $SiH_2Cl_2$ or other suitable silicon source gas may be used. The dielectric layer 30 as deposited is amorphous and paraelectric. The thickness of the dielectric layer 30 is in a range from about 1 nm to about 5 nm in some embodiments.

Figure 2B:
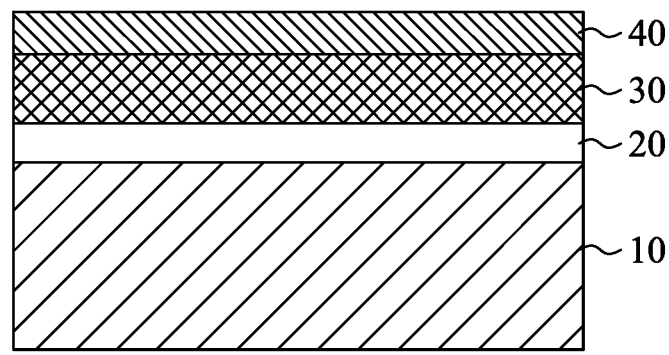

After the dielectric layer 30 is formed, a capping layer 40 is formed on the dielectric layer 30, as shown in FIG. 2B. The capping layer 40 includes a TiN based material, such as TiN and TiN doped with one or more additional elements, in some embodiments. In some embodiments, the TiN layer is doped with Si. The capping layer 40 can be formed by ALD, CVD or physical vapor deposition including sputtering or any other suitable methods. When ALD is utilized, the ALD is performed at a temperature in a range from about 400° C. to about 500° C. in some embodiments. The thickness of the capping layer 40 is in a range from about 1 nm to about 5 nm in some embodiments.

Figure 2C:
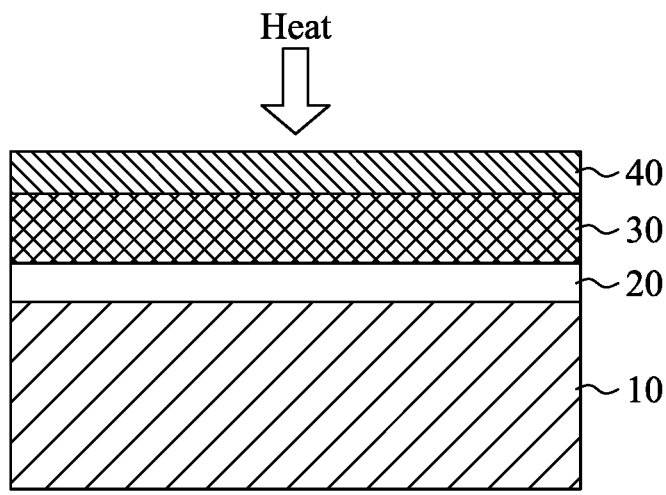

After the capping layer 40 is formed, an annealing operation is performed as shown in FIG. 2C. The annealing operation is performed at a temperature in a range from about 700° C. to about 1000° C. in an inert gas ambient, such as $N_2$, Ar and/or He. The annealing period is in a range from about 10 sec to 1 min in some embodiments. After the annealing, a cooling operation is performed. In some embodiments, the substrate is cooled down to less than 100° C. or to room temperature (about 25° C.). The annealing operation after the capping layer 40 is formed provides a driving force for the doped $HfO_2$ structure transition from amorphous phase to high-temperature tetragonal phase, and capping layer 40 provides the mechanical stress needed for the crystalline transition from the high-temperature tetragonal phase to the high-pressure ferroelectric orthorhombic phase during cooling.

In some embodiments, after the capping layer 40 is formed, an amorphous silicon layer is formed on the capping layer 40, and then the annealing operation is performed. After the annealing operation and cooling operation are performed, the amorphous silicon layer is removed.

Figure 2D:
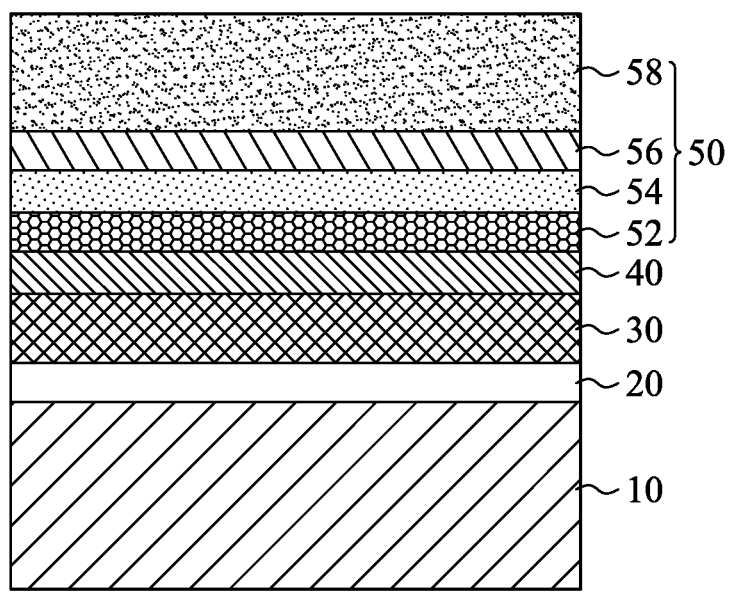

After the cooling operation, a barrier layer 52 made of, for example, TaN, is formed over the capping layer 40, as shown in FIG. 2D. The barrier layer 52 can be formed by ALD, CVD or physical vapor deposition including sputtering or any other suitable methods. When ALD is utilized, the ALD is performed at a temperature in a range from about 300° C. to about 400° C. in some embodiments. The thickness of the barrier layer 52 is in a range from about 1 nm to about 5 nm in some embodiments. In some embodiments, the annealing operation to convert the amorphous structure to the orthorhombic structure may be performed after the barrier layer 52 is formed.

Further, a work function adjustment layer 54 is formed on the barrier layer 52. In some embodiments, the work function adjustment layer 54 includes TiN for a p-type transistor and TiAl for an n-type transistor. Any other suitable metallic material can be used as the work function adjustment layer 54. In some embodiments, a TiAl layer is also formed on a TiN work function adjustment layer for a p-type transistor. The work function adjustment layer 54 can be formed by ALD, CVD or physical vapor deposition including sputtering or any other suitable methods. When ALD is utilized, the ALD is performed at a temperature in a range from about 300° C. to about 400° C. in some embodiments. The thickness of the work function adjustment layer 54 is in a range from about 1 nm to about 5 nm in some embodiments.

Further, a main gate metal layer 58 is formed over the work function adjustment layer 54. The main gate metal layer 58 includes one or more metals, such as W, Cu, Ti, Al and Co, or other suitable material. In some embodiments, when the main gate metal layer 58 is W, a glue layer 56 is formed on the work function adjustment layer 54. In some embodiments, the glue layer 56 is Ti. As shown in FIG. 2D, the gate electrode 50 may include a barrier layer 52 disposed on the capping layer 40, a work function adjustment layer 54 disposed on the barrier layer 52, a glue layer 56 disposed on the work function adjustment layer 54 and a main gate metal layer 58. In some embodiments, the capping layer may be considered as a part of the gate electrode 50.

Figure 3A:
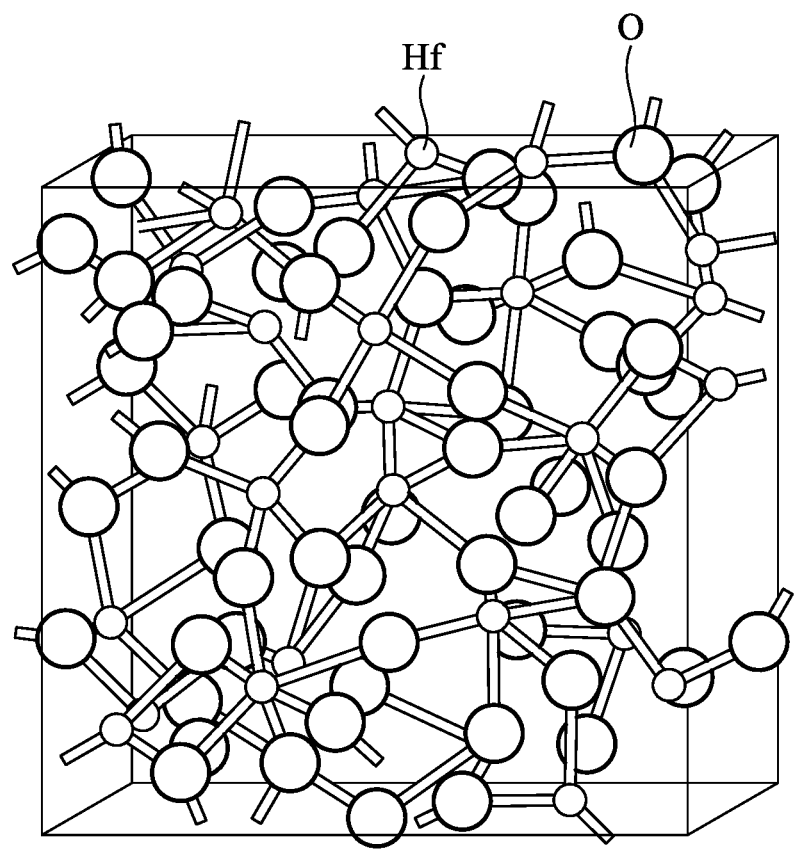
Figure 3B:
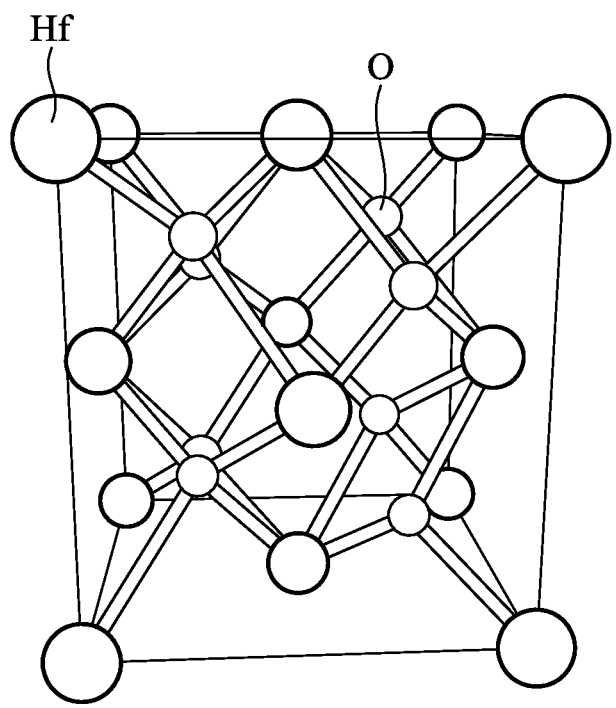
Figure 3C:
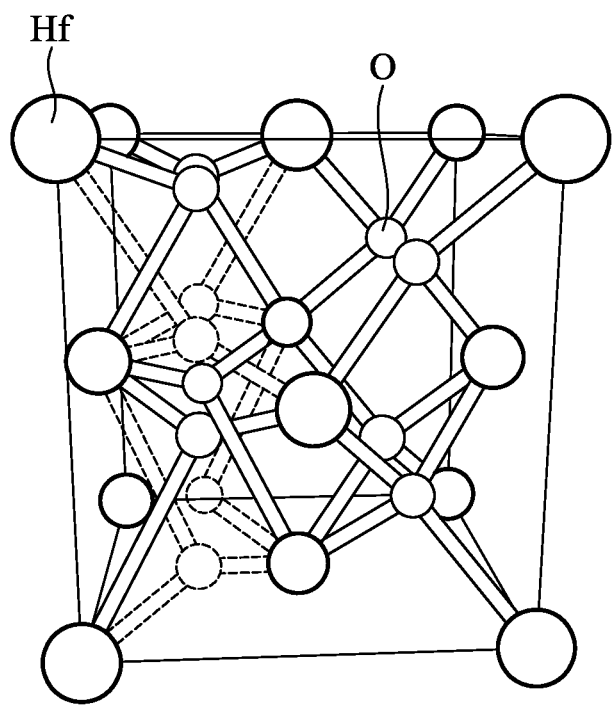

FIGS. 3A, 3B, 3C and 3D show various atomic structures of $HfO_2$. FIG. 3A shows the amorphous structure of the doped $HfO_2$ as deposited. By applying heat, the amorphous structure transitions to a tetragonal crystal structure (phase), as shown in FIG. 3B. When the heated $HfO_2$ having a tetragonal crystal structure is cooled with a capping metal thereon, the $HfO_2$ becomes an orthorhombic crystal structure (phase), as shown in FIG. 3C. If the heated $HfO_2$ having a tetragonal crystal structure is cooled without the capping metal thereon, the $HfO_2$ becomes a mixture of a monolithic crystal structure (left) and a tetragonal crystal structure (right), as shown in FIG. 3D. The orthorhombic $HfO_2$ has a non-centrosymmetric structure, and thus spontaneous polarization is generated by four oxygen ions displacement. Accordingly, better ferroelectric properties can be obtained by the orthorhombic $HfO_2$.

Figure 4:
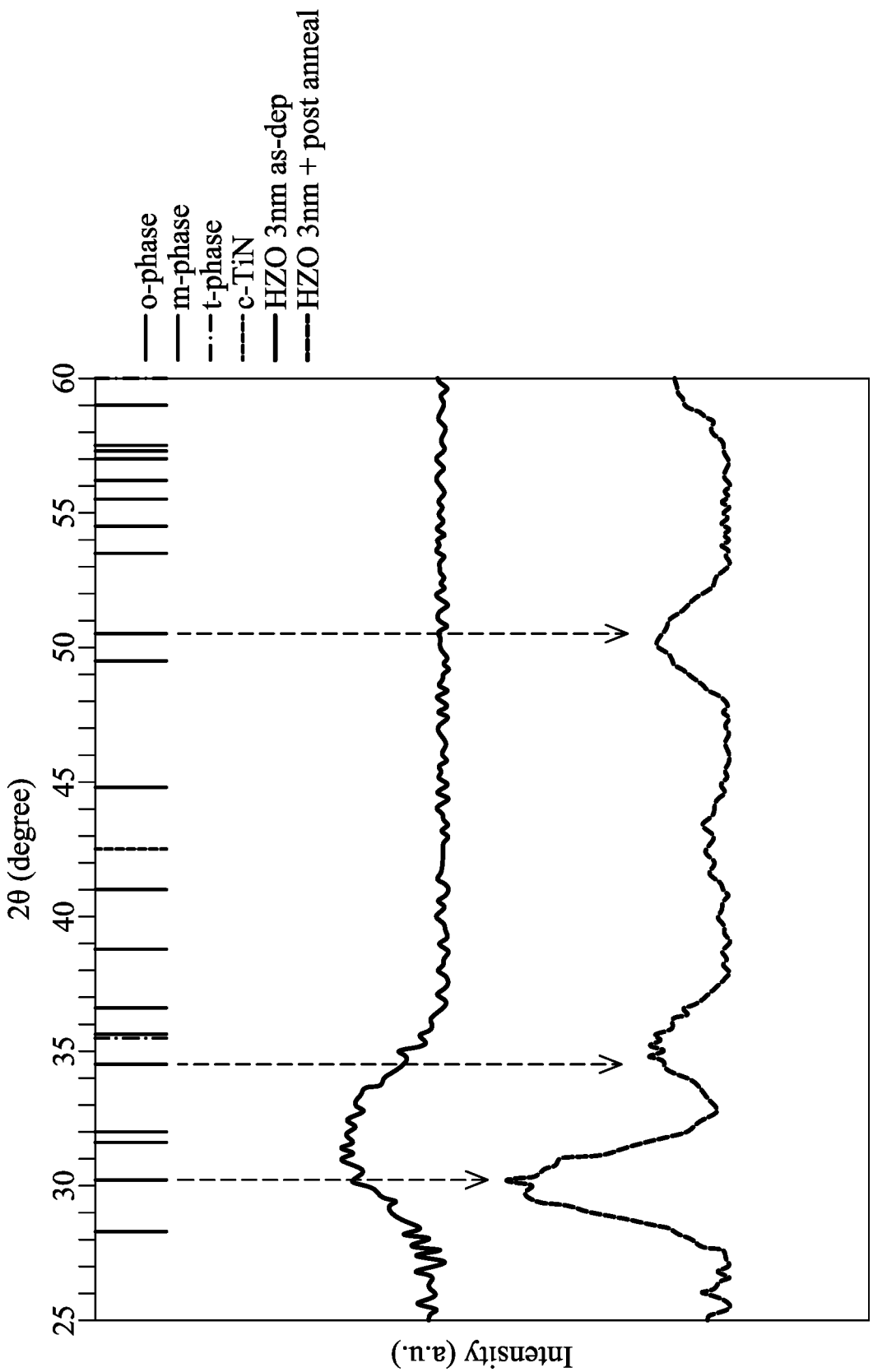
FIG. 4 shows X-Ray Diffraction (XRD) measurement results.

FIG. 4 shows X-Ray Diffraction (XRD) measurement results. The samples are a 3-nm thick doped $HfO_2$ as deposited and a 3-nm thick doped $HfO_2$ after the annealing operation with a capping layer. The doped $HfO_2$ as deposited shows a broad spectrum indicating amorphous structure. In contrast, the doped $HfO_2$ after the annealing operation with a capping layer shows peaks corresponding to orthorhombic phase.

Figure 5:
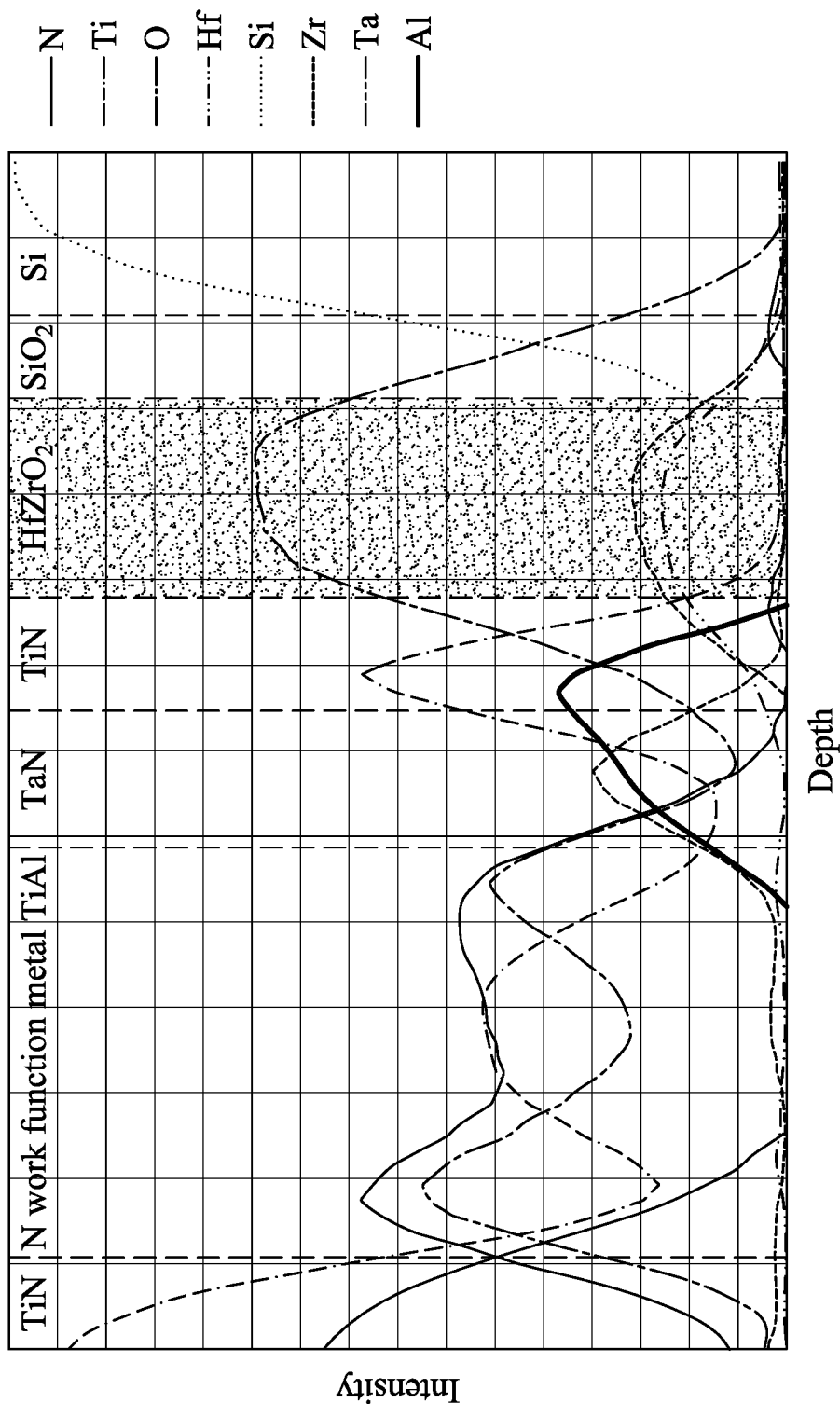
FIGS. 5 and 6 show electron energy loss spectroscopy (EELS) measurement results.
Figure 6:
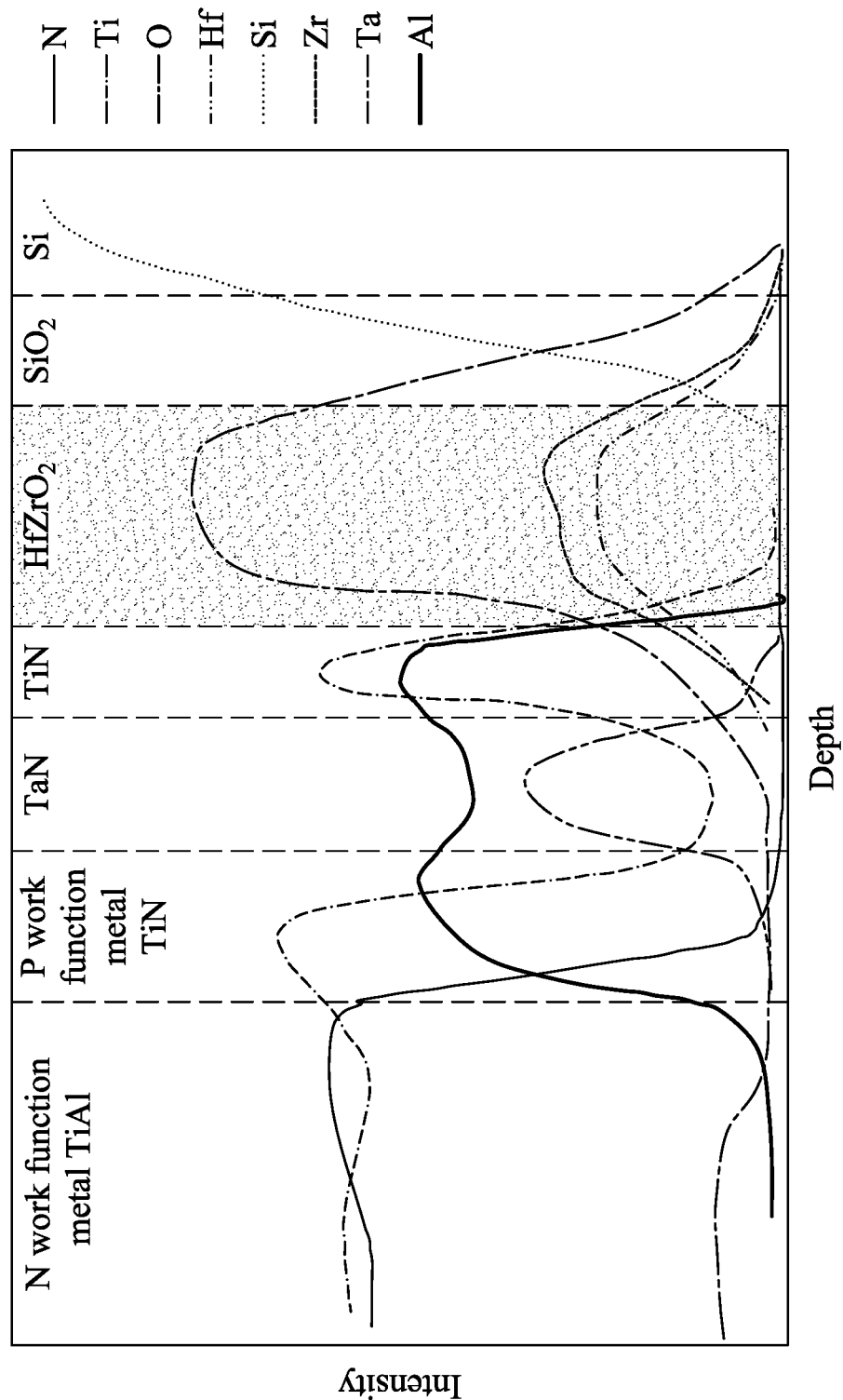

FIGS. 5 and 6 show electron energy loss spectroscopy (EELS) measurement results. As set forth above, after the dielectric layer 30 is converted to an orthorhombic phase, additional layers are formed with some thermal operations. The dopant elements in $HfO_2$ such as semiconductor material (Si) and metal elements (Zr, Al, La, Y, Gd and/or Sr) introduced by in-situ doping during the ALD growth are substantially uniformly distributed in the doped $HfO_2$ layer. As shown in FIGS. 5 and 6, Ti arising from the capping layer 40 (TiN based material) diffuses into the $HfZrO_2$ layer. When a TiAl layer is used as a work function adjustment layer 54 for an n-type transistor, Al may also diffuse into the $HfZrO_2$ layer, as shown in FIG. 5. In some embodiments, the $HfZrO_2$ layer includes Al in an amount of 5-7 mol %. When a TiN layer is used as a work function adjustment layer 54 for a p-type transistor, Ti originating from the TiN work function adjustment layer may also diffuse into the $HfZrO_2$ layer, as shown in FIG. 6. For the p-type transistor, Al may not diffuse into the $HfZrO_2$ layer (below a detection limit), even if a TiAl layer is formed on the TiN work function adjustment layer. In some embodiments, the $HfZrO_2$ layer includes Ti in an amount of 2-5 mol %.

In some embodiments, the ferroelectric $HfO_2$ layer consists of an orthorhombic crystal phase. In other embodiments, the ferroelectric $HfO_2$ layer is substantially formed by an orthorhombic crystal phase. In such a case, the orthorhombic crystal phase is about 80% or more of the ferroelectric $HfO_2$ layer, and the remaining phases may be amorphous, a monolithic phase and/or a tetragonal phase.

FIGS. 7A-13C show various stages of manufacturing operations for an NC FET in accordance with an embodiment of the present disclosure. It is understood that additional operations can be provided before, during, and after the processes shown by FIGS. 7A-13C, and some of the operations described below are replaced or eliminated, for additional embodiments of the method. The order of the operations/processes may be interchangeable. Material, configuration, dimensions and/or processes the same as or similar to the foregoing embodiments described with FIGS. 1A-2D may be employed in the following embodiments, and detailed explanation thereof may be omitted.

Figure 7B:
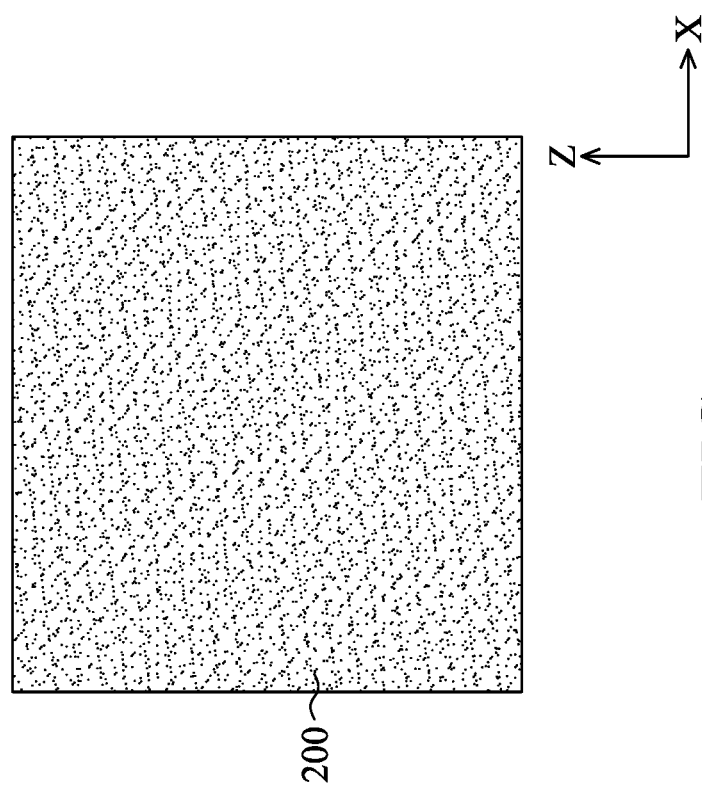
FIGS. 7A, 7B, 7C and 7D show various stages of manufacturing operations for an NC FET in accordance with an embodiment of the present disclosure.
Figure 7A:
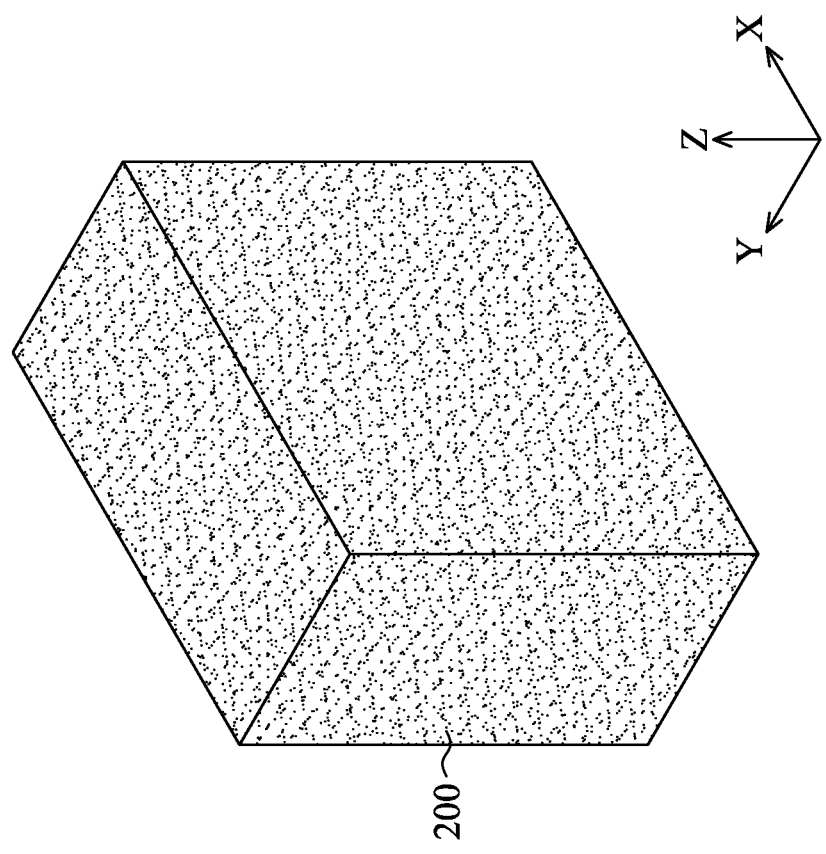

FIG. 7A shows a perspective view and FIG. 7B is a cross sectional view along the X direction, showing one of various stages of the manufacturing operation according to an embodiment of the present disclosure. As shown in FIGS. 7A and 7B, a substrate 200 is provided. In some embodiments, the substrate 200 is made of a suitable elemental semiconductor, such as silicon, diamond or germanium; a suitable alloy or compound semiconductor, such as Group-IV compound semiconductors (silicon germanium (SiGe), silicon carbide (SiC), silicon germanium carbide (SiGeC), GeSn, SiSn, SiGeSn), Group III-V compound semiconductors (e.g., gallium arsenide (GaAs), indium gallium arsenide (InGaAs), indium arsenide (InAs), indium phosphide (InP), indium antimonide (InSb), gallium arsenic phosphide (GaAsP), or gallium indium phosphide (GaInP)), or the like. Further, the substrate 200 may include an epitaxial layer (epi-layer), which may be strained for performance enhancement, and/or may include a silicon-on-insulator (SOI) structure. The upper portion of the substrate 200 can be multi-layers of Si and SiGe.

Figure 7D:
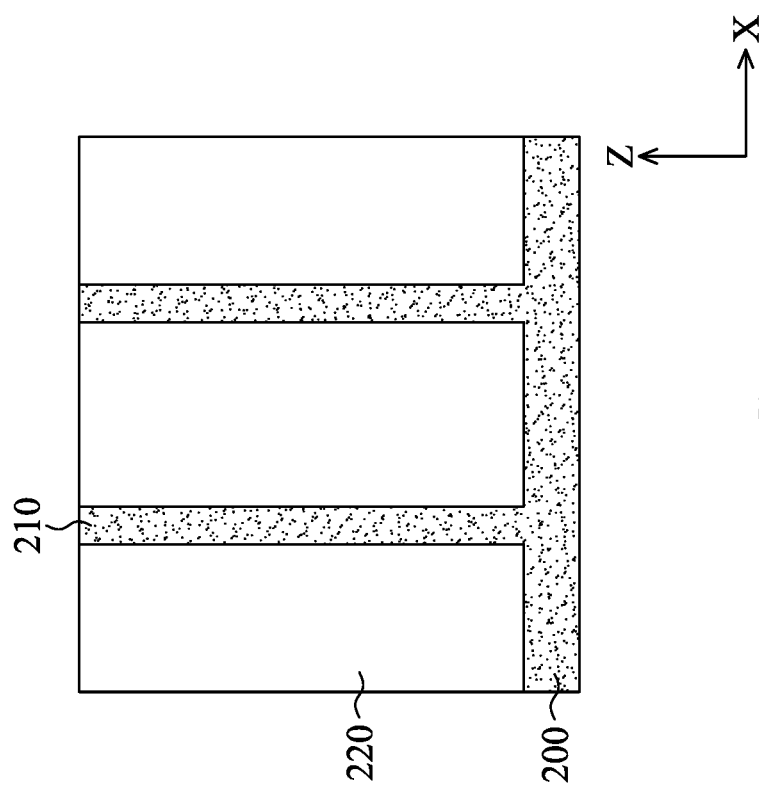
Figure 7C:
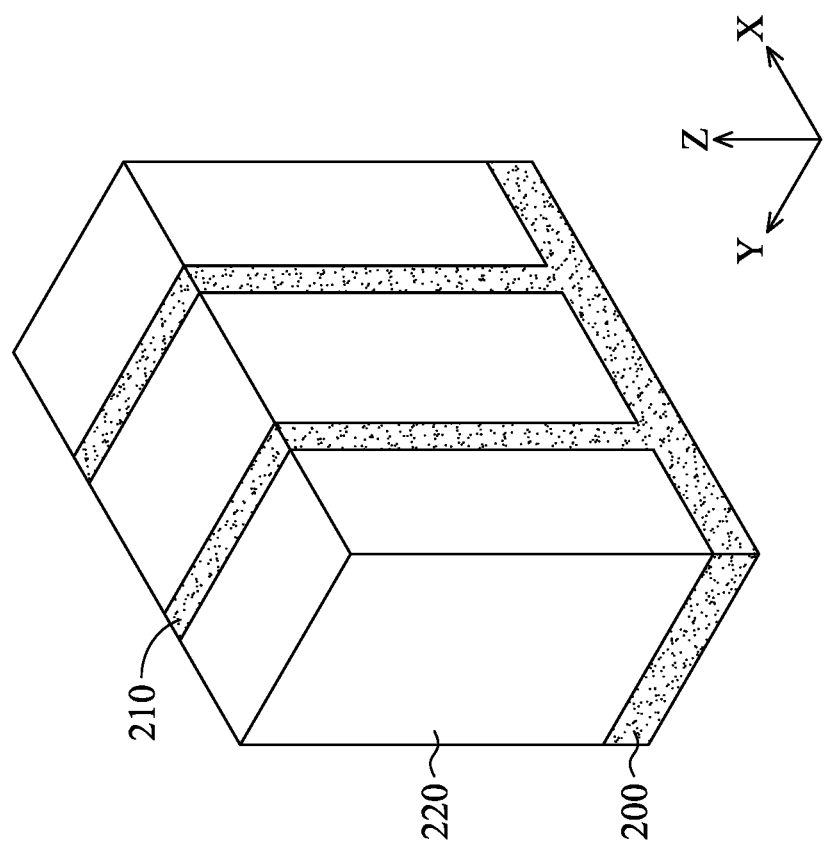

FIG. 7C shows a perspective view and FIG. 7D is a cross sectional view along the X direction, showing one of various stages of the manufacturing operation according to an embodiment of the present disclosure. As shown in FIGS. 7C and 7D, fin structures 210 are formed by etching the substrate 200 and forming an isolation insulating layer 220. The fin structures 210 may be patterned by any suitable method. For example, the fin structures 210 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin structures 210. In some embodiments, the width of the fin structures 210 is in a range from about 4 nm to about 10 nm and the pitch of the fin structures 210 is in a range from about 10 nm to about 50 nm.

Then, an insulating material layer 220 is formed over the fin structures, thereby embedding the fin structures. The insulating material layer 220 may be made of suitable dielectric materials such as silicon oxide, silicon nitride, silicon oxynitride, fluorine-doped silicate glass (FSG), low-k dielectrics such as carbon doped oxides, extremely low-k dielectrics such as porous carbon doped silicon dioxide, a polymer such as polyimide, combinations of these, or the like. In some embodiments, the insulating material layer 220 is formed through a process such as CVD, flowable CVD (FCVD), or a spin-on-glass process, although any acceptable process may be utilized. Subsequently, portions of the insulating material layer 220 extending over the top surfaces of the fin structures 210 are removed using, for example, an etch process, chemical mechanical polishing (CMP), or the like, as shown in FIGS. 7C and 7D.

Figure 8B:
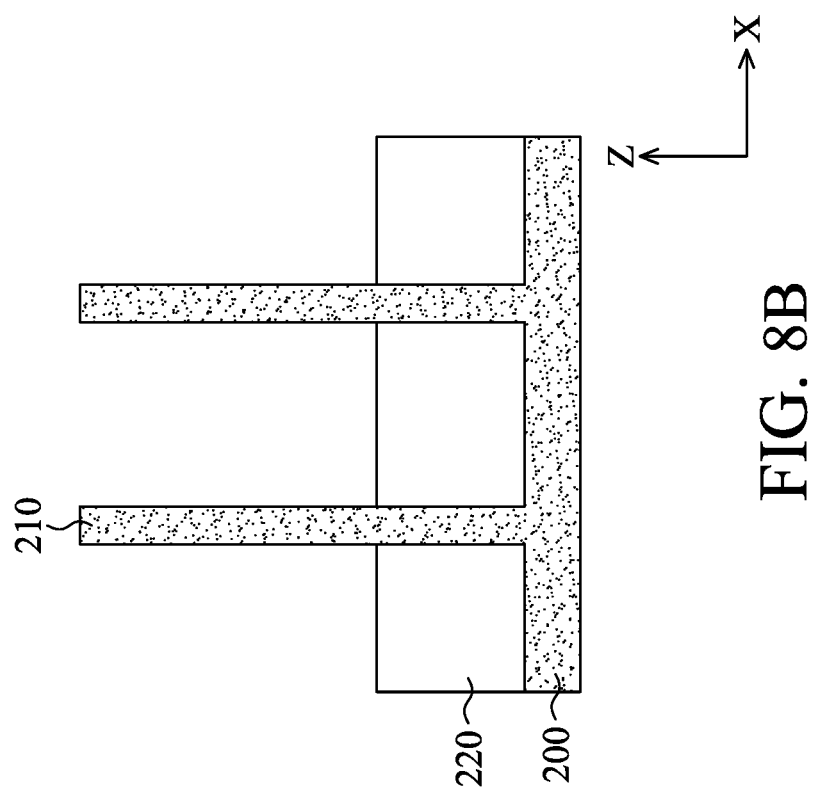
FIGS. 8A, 8B, 8C and 8D show various stages of manufacturing operations for an NC FET in accordance with an embodiment of the present disclosure.
Figure 8A:
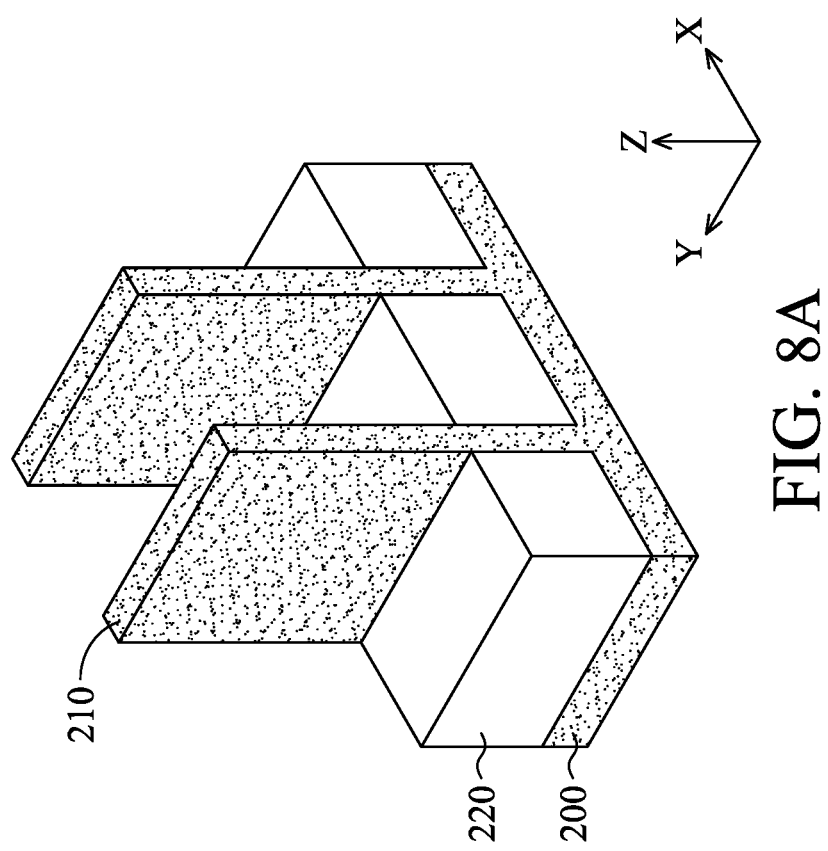

FIG. 8A shows a perspective view and FIG. 8B is a cross sectional view along the X direction, showing one of various stages of the manufacturing operation according to an embodiment of the present disclosure. Further, as shown in FIGS. 8A and 8B, the insulating material layer 220 is recessed so that the upper portions of the fin structures 210 are exposed. The recessed insulating material layer 220 is called an isolation insulating layer or a shallow trench isolation (STI). The height of the exposed fin structures 210 measured from the upper surface of the isolation insulating layer 220 is in a range about 30 nm to about 100 nm in some embodiments.

Figure 8D:
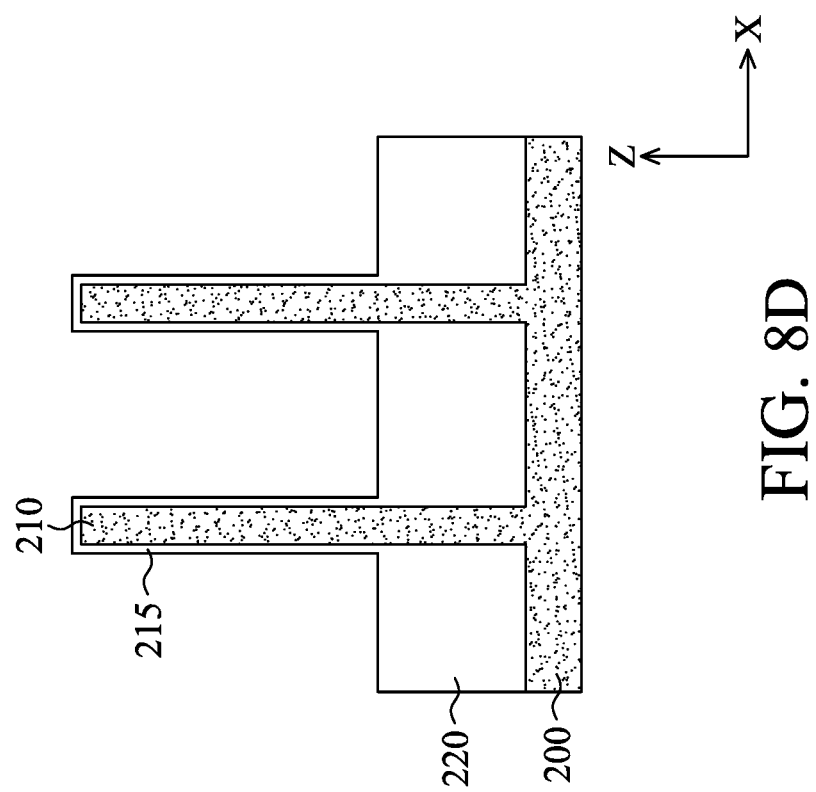
Figure 8C:
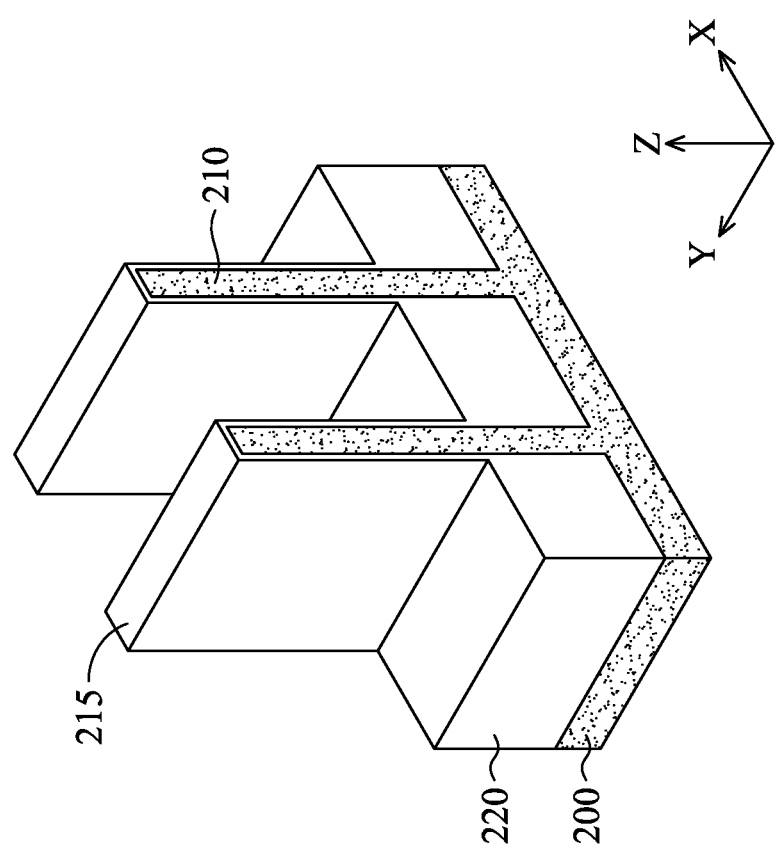

FIG. 8C shows a perspective view and FIG. 8D is a cross sectional view along the X direction, showing one of various stages of the manufacturing operation according to an embodiment of the present disclosure. Subsequently, a dummy gate dielectric layer 215 is formed over the upper portions of the fin structure 210, as shown in FIGS. 8C and 8D. The dummy gate dielectric layer 215 is a silicon oxide layer formed by CVD or ALD, in some embodiments. The thickness of the dummy gate dielectric layer 215 is in a range from about 1 nm to about 3 nm in some embodiments.

Then, a polysilicon layer 230 is formed over the dummy gate electrode layer 215, and further a hard mask layer is formed on the polysilicon layer. The hard mask layer is patterned into hard mask pattern 235 by suitable lithography and etching operations, as shown in FIGS. 9A-9C. The hard mask pattern 235 includes one or more layers of insulating material, such as silicon oxide and silicon nitride, in some embodiments.

FIG. 9A shows a perspective view, FIG. 9B is a cross sectional view along the Y direction and FIG. 9C is a cross sectional view along the X direction, showing one of various stages of the manufacturing operation according to an embodiment of the present disclosure. By using the hard mask pattern 235 as an etching mask, the polysilicon layer is patterned into dummy gate electrodes 230, as shown in FIGS. 9A-9C. In some embodiments, the width of the dummy gate electrode 230 is in a range from about 8 nm to about 20 nm.

FIG. 10A shows a perspective view, FIG. 10B is a cross sectional view along the Y direction and FIG. 10C is a cross sectional view along the X direction, showing one of various stages of the manufacturing operation according to an embodiment of the present disclosure. Sidewall spacers 240 are formed on opposing side faces of the dummy gate electrodes 230. The sidewall spacers 240 include one or more layers of insulating material, such as silicon oxide, silicon nitride and silicon oxynitride. Moreover, source/drain epitaxial layers 250 are formed over source/drain regions of the fin structures 210. The source/drain epitaxial layer 250 includes SiP, SiAs, SiGeP, SiGeAs, GeP, GeAs, and/or SiGeSn or other suitable material for an n-type FET, and SiB, SiGa, SiGeB, SiGeGa, GeB, GeGa and/or SiGeSn or other suitable material for a p-type FET. The thickness of the source/drain epitaxial layers 250 is in a range from about 3 nm to about 8 nm in some embodiments. In some embodiments, an alloy layer, such as, a silicide layer, is formed over the source/drain epitaxial layers 250.

FIG. 11A shows a perspective view, FIG. 11B is a cross sectional view along the Y direction and FIG. 11C is a cross sectional view along the X direction, showing one of various stages of the manufacturing operation according to an embodiment of the present disclosure. Subsequently, a contact etch stop layer (CESL) 245 and an interlayer dielectric layer 260 are formed, and a planarization operation, such as a CMP operation, is performed to exposed upper surfaces of the dummy gate electrodes 230, as shown in FIGS. 11A-11C.

In some embodiments, the CESL layer 245 is made of a silicon nitride based material, such as SiN and SiON, and the interlayer dielectric layer 260 is made of a silicon oxide based material, such as $SiO_2$ or a low-k material. In some embodiments, an annealing operation is performed after the interlayer dielectric layer is formed.

FIG. 12A shows a perspective view, FIG. 12B is a cross sectional view along the Y direction and FIG. 12C is a cross sectional view along the X direction, showing one of various stages of the manufacturing operation according to an embodiment of the present disclosure. Then, the dummy gate electrodes 230 and the dummy gate dielectric layer 215 are removed by using dry and/or wet etching, thereby forming gate spaces 265, as shown in FIGS. 12A-12C. Further, in the gate spaces 265, an interfacial layer 271 and a dielectric layer 270 are formed as shown in FIGS. 12A-12C. As set forth above, the interfacial layer 271 is made of silicon oxide, and the dielectric layer 270 is a doped $HfO_2$ layer.

FIG. 13A shows a perspective view, FIG. 13B is a cross sectional view along the Y direction and FIG. 13C is a cross sectional view along the X direction, showing one of various stages of the manufacturing operation according to an embodiment of the present disclosure. Then, similar to the operations described with FIGS. 2A-2D, a capping layer (not shown) may optionally be formed, and an annealing operation is performed to convert the amorphous $HfO_2$ layer to an orthorhombic $HfO_2$ layer. Further, a gate electrode 280 is formed, as shown in FIGS. 13A-13C. The capping layer and the gate electrode may be formed using a suitable process such as ALD, CVD, PVD, plating, or combinations thereof. After the conductive materials for the gate electrode are formed, a planarization operation, such as CMP, is performed to remove excess materials above the interlayer dielectric layer 260.

After forming the gate structures, further CMOS processes are performed to form various features such as additional interlayer dielectric layers, contacts/vias, interconnect metal layers, and passivation layers, etc.

FIGS. 14A-14D show other manufacturing operations for an NC FinFET in accordance with some embodiments of the present disclosure. Throughout the various views and illustrative embodiments, like reference numbers are used to designate like elements. It is understood that additional operations can be provided before, during, and after processes shown by FIGS. 14A-15D, and some of the operations described below can be replaced or eliminated, for additional embodiments of the method. The order of the operations/processes may be interchangeable. Material, configuration, dimensions and/or processes the same as or similar to the foregoing embodiments described with respect to FIGS. 1A, 2A-2D and 7A-13C may be employed in the following embodiments, and detailed explanation thereof may be omitted.

As shown in FIG. 14A, the fin structures 320 are patterned by using the hard mask pattern 312, and the isolation insulating layer 325 is formed. Then, a dummy gate dielectric layer (not shown) and a polysilicon layer 332 are formed over the fin structures 320, and further a hard mask pattern 334 is formed on the polysilicon layer 332, as shown in FIG. 14B. The hard mask pattern 324 includes one or more layers of insulating material, such as silicon oxide and silicon nitride.

Figures 14C, 14D:
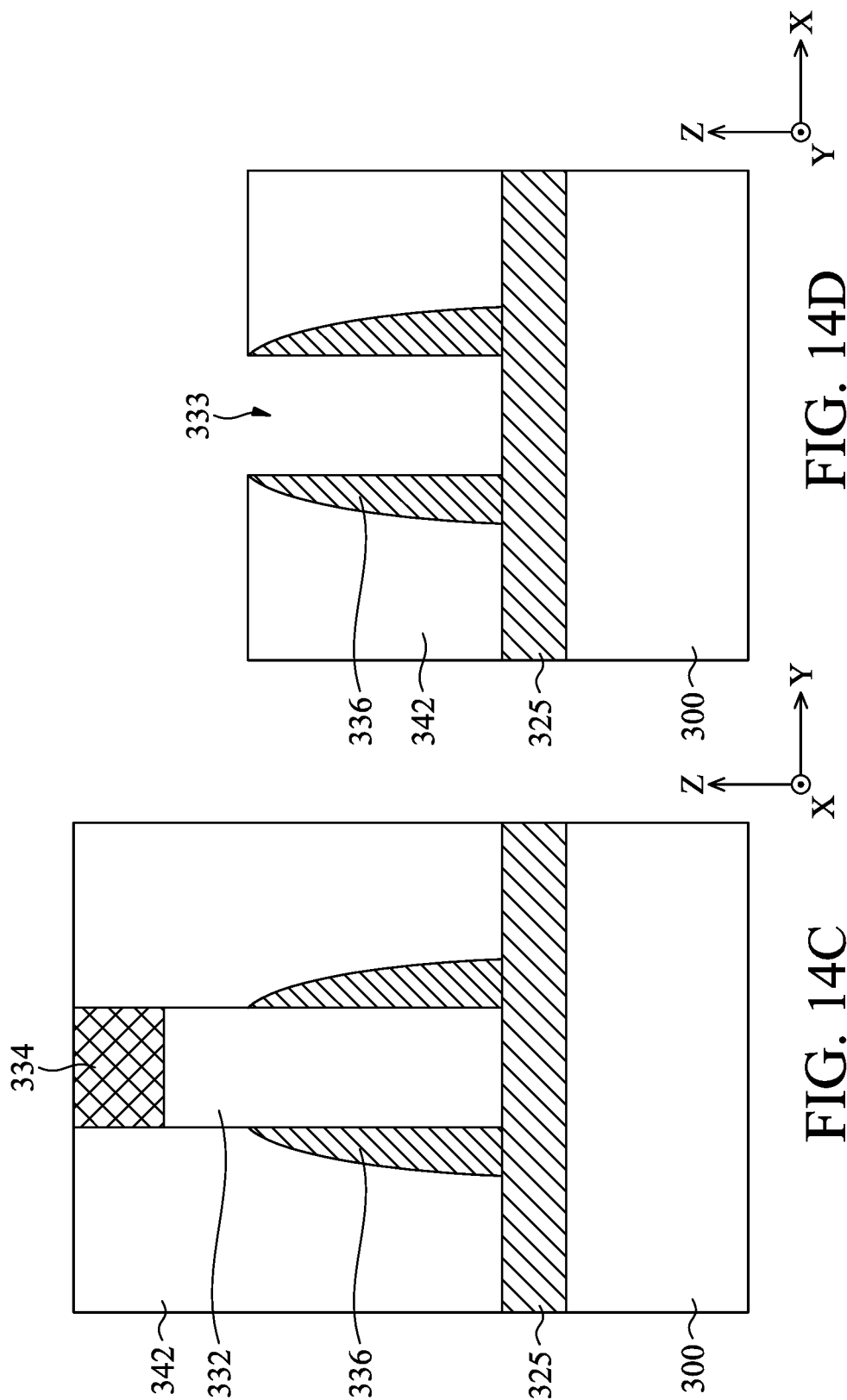

By using the hard mask pattern 334 as an etching mask, the polysilicon layer 332 is patterned into a dummy gate electrode 332. Further, sidewall spacers 336 are formed on opposing side faces of the dummy gate electrode 332, and an interlayer dielectric layer 342 is formed, as shown in FIG. 14C. The sidewall spacers 336 include one or more layers of insulating material, such as silicon oxide, silicon nitride and silicon oxynitride, and the interlayer dielectric layer 342 includes one or more layers of insulating material such as silicon oxide based material such as silicon dioxide ($SiO_2$) and SiON. The material of the sidewall spacers 333 and the material of the interlayer dielectric layer 342 are different from each other, so that each of these layers can be selectively etched. In one embodiment, the sidewall spacer 333 is made of SiOCN, SiCN or SiON and the interlayer dielectric layer 342 is made of $SiO_2$.

Then, the dummy gate electrode 332 and the dummy gate dielectric layer are removed by using dry and/or wet etching, thereby forming a gate space 333, as shown in FIG. 14D.

In the gate space, a first gate dielectric layer 303 and a first gate electrode 304 are formed as shown in FIGS. 15A and 15B. After the conductive material is formed over the first gate dielectric layer 303, a planarization operation, such as CMP, is performed to form the first gate electrode 304. The first gate dielectric layer 303 is made of, for example, a high-k dielectric material, and the first gate electrode 304 is made of, for example, a conductive material such as TiN or other metal material. Further, an etch-back operation is performed to reduce the height of the first gate dielectric layer 303 and the first gate electrode 304. The conductive material may be formed using a suitable process such as ALD, CVD, PVD, plating, or combinations thereof.

Then, a ferroelectric dielectric layer 305 and a second gate electrode 306 are formed in the gate space 333, as shown in FIGS. 15C and 15D. A ferroelectric dielectric layer 305 is formed by the operations described with respect to FIGS. 2A-2D. A conductive material is formed over the ferroelectric dielectric layer 303. After the conductive material is formed over the ferroelectric dielectric layer 305, a planarization operation, such as CMP, is performed to form the second gate electrode 306, as show in FIGS. 15C and 15D.

After forming the gate structures, further CMOS processes are performed to form various features such as additional interlayer dielectric layers, contacts/vias, interconnect metal layers, and passivation layers, etc.

Other methods and structures for manufacturing MIMIS NC FETs are described in U.S. patent application Ser. Nos. 15/476,221 and 15/447,479, the entire contents of each of which are incorporated herein by reference.

It will be understood that not all advantages have been necessarily discussed herein, no particular advantage is required for all embodiments or examples, and other embodiments or examples may offer different advantages.

For example, in the present disclosure, a doped $HfO_2$ having an orthorhombic crystal phase is employed for an NC FET. By using a capping metallic layer during an annealing operation, it is possible to effectively convert an amorphous structure of the as-deposited $HfO_2$ layer to an orthorhombic crystal structure. As compared to other perovskite ferroelectric films (such as, PZT or $BaTiO_3$), the ferroelectric $HfO_2$ disclosed herein can maintain polarization without degradation down to 3 nm.

In accordance with an aspect of the present disclosure, in a method of manufacturing a negative capacitance structure, a dielectric layer is formed over a substrate. A first metallic layer is formed over the dielectric layer. After the first metallic layer is formed, an annealing operation is performed, followed by a cooling operation. A second metallic layer is formed. After the cooling operation, the dielectric layer becomes a ferroelectric dielectric layer including an orthorhombic crystal phase. In one or more of the foregoing or following embodiments, the dielectric layer includes $HfO_2$ doped with one or more selected from the group consisting of Si, Zr, Al, La, Y, Gd and Sr. In one or more of the foregoing or following embodiments, the dielectric layer includes $HfO_2$ doped with Si in an amount of 2-6 mol % or $HfZrO_2$. In one or more of the foregoing or following embodiments, the annealing operation is performed at a temperature in a range from 700° C. to 1000° C. in an inert gas ambient. In one or more of the foregoing or following embodiments, the second metallic layer is formed after the cooling operation. In one or more of the foregoing or following embodiments, the first metallic layer includes TiN or TiN doped with Si. In one or more of the foregoing or following embodiments, the second metallic layer is TaN. In one or more of the foregoing or following embodiments, the orthorhombic crystal phase is polycrystalline. In one or more of the foregoing or following embodiments, the dielectric layer as formed is amorphous.

In accordance with another aspect of the present disclosure, in a method of manufacturing a negative capacitance field effect transistor (NC-FET), a dielectric layer is formed over a channel layer. A capping metallic layer is formed over the dielectric layer. After the capping metallic layer is formed, an annealing operation is performed, followed by a cooling operation. A barrier layer is formed over the capping layer. A work function adjustment layer is formed over the barrier layer. After the cooling operation, the dielectric layer becomes a ferroelectric dielectric layer including an orthorhombic crystal phase. In one or more of the foregoing or following embodiments, the dielectric layer includes $HfO_2$ containing Si or $HfO_2$ containing Zr. In one or more of the foregoing or following embodiments, the annealing operation is performed at a temperature in a range from 700° C. to 1000° C. in an inert gas ambient. In one or more of the foregoing or following embodiments, the capping metallic layer includes TiN or TiN doped with Si. In one or more of the foregoing or following embodiments, the barrier layer is formed after the cooling operation. In one or more of the foregoing or following embodiments, the barrier layer is TaN. In one or more of the foregoing or following embodiments, a gate metal layer is further formed over the work function adjustment layer. In one or more of the foregoing or following embodiments, a glue layer is further formed over the work function adjustment layer before the gate metal layer is formed. In one or more of the foregoing or following embodiments, an interfacial oxide layer is further formed over the channel layer before the dielectric layer is formed.

In accordance with another aspect of the present disclosure, in a method of manufacturing a negative capacitance fin field effect transistor (NC-FinFET), a dummy gate structure is formed over a fin structure. A source/drain structure is formed over the fin structure on opposing sides of the dummy gate structure. An interlayer dielectric layer is formed over the source/drain structure. The dummy gate structure is removed, thereby exposing a channel region of the fin structure. A dielectric layer is formed over the channel region. A capping metallic layer is formed over the dielectric layer. After the capping metallic layer is formed, an annealing operation is performed, followed by a cooling operation. A gate electrode including one or more metallic layers is formed. After the cooling operation, the dielectric layer becomes a ferroelectric dielectric layer including an orthorhombic crystal phase. In one or more of the foregoing or following embodiments, the dielectric layer including an orthorhombic crystal phase includes $HfO_2$ containing Si or $HfO_2$ containing Zr, and further includes Ti.

In accordance with one aspect of the present disclosure, a negative capacitance structure includes a first conductive layer, a ferroelectric dielectric layer disposed over the first conductive layer, and a second conductive layer disposed over the ferroelectric dielectric layer. The ferroelectric dielectric layer includes an orthorhombic crystal phase. In one or more of the foregoing or following embodiments, the ferroelectric dielectric layer includes $HfO_2$ doped with one or more selected from the group consisting of Si, Zr, Al, La, Y, Gd and Sr. In one or more of the foregoing or following embodiments, the ferroelectric dielectric layer includes $HfO_2$ doped with at least one selected from the group consisting of Si and Zr. In one or more of the foregoing or following embodiments, the ferroelectric dielectric layer further includes Ti in an amount of 2-5 mol %. In one or more of the foregoing or following embodiments, the ferroelectric dielectric layer further includes Al in an amount of 5-7 mol %. In one or more of the foregoing or following embodiments, the ferroelectric dielectric layer includes $HfO_2$ doped with Si in an amount of 2-6 mol %. In one or more of the foregoing or following embodiments, the ferroelectric dielectric layer includes $HfZrO_2$. In one or more of the foregoing or following embodiments, the second metallic layer includes TiN or TiN doped with Si.

In accordance with another aspect of the present disclosure, a negative capacitance field effect transistor (NC-FET) includes a channel layer made of a semiconductor, a ferroelectric dielectric layer disposed over the channel layer, and a gate electrode layer disposed over the ferroelectric dielectric layer. The ferroelectric dielectric layer includes an orthorhombic crystal phase. In one or more of the foregoing or following embodiments, the ferroelectric dielectric layer includes $HfO_2$ doped with one or more selected from the group consisting of Si, Zr, Al, La, Y, Gd and Sr. In one or more of the foregoing or following embodiments, the ferroelectric dielectric layer includes $HfO_2$ doped with at least one selected from the group consisting of Si and Zr. In one or more of the foregoing or following embodiments, the gate electrode layer includes a first conductive layer disposed on the ferroelectric dielectric layer, and the first conductive layer is made of TiN or TiN doped with one or more elements. In one or more of the foregoing or following embodiments, the gate electrode layer further includes a second conductive layer disposed on the first conductive layer, and the second conductive layer is made of TaN. In one or more of the foregoing or following embodiments, the gate electrode layer further includes a work function adjustment layer disposed on the second conductive layer, and a tungsten layer disposed over the work function adjustment layer. In one or more of the foregoing or following embodiments, the NC-FET is a p-type FET and the work function adjustment layer includes TiN. In one or more of the foregoing or following embodiments, the ferroelectric dielectric layer further includes Ti in an amount of 2-5 mol %. In one or more of the foregoing or following embodiments, the NC-FET is an n-type FET and the work function adjustment layer includes TiAl. In one or more of the foregoing or following embodiments, the ferroelectric dielectric layer further includes Al in an amount of 5-7 mol %. In one or more of the foregoing or following embodiments, the NC-FET is a fin FET and the channel layer is a part of a fin structure.

In accordance with another aspect of the present disclosure, a negative capacitance field effect transistor (NC-FET) includes a channel layer made of a semiconductor, a first dielectric layer disposed over the channel layer, a first conductive layer disposed over the first dielectric layer, a second dielectric layer disposed over the first conductive layer, and a gate electrode layer disposed over the second dielectric layer. The second dielectric layer includes $HfO_2$ having an orthorhombic crystal phase.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A negative capacitance structure, comprising:
   a first conductive layer;
   a ferroelectric dielectric layer disposed on and in direct contact with the first conductive layer; and
   a second conductive layer disposed over the ferroelectric dielectric layer,
   wherein the ferroelectric dielectric layer includes an orthorhombic crystal phase, and
   the ferroelectric dielectric layer further includes at least one of a monolithic phase or a tetragonal phase and the orthorhombic crystal phase is at least 80% of the ferroelectric layer.

2. The negative capacitance structure of claim 1, wherein the ferroelectric dielectric layer includes $HfO_2$ doped with one or more selected from the group consisting of Si, Zr, Al, La, Y, Gd and Sr.

3. The negative capacitance structure of claim 1, wherein the ferroelectric dielectric layer includes $HfO_2$ doped with at least one selected from the group consisting of Si and Zr.

4. The negative capacitance structure of claim 3, wherein the ferroelectric dielectric layer further includes Ti in an amount of 2-5 mol %.

5. The negative capacitance structure of claim 3, wherein the ferroelectric dielectric layer further includes Al in an amount of 5-7 mol %.

6. The negative capacitance structure of claim 1, wherein the ferroelectric dielectric layer includes $HfO_2$ doped with Si in an amount of 2-6 mol %.

7. The negative capacitance structure of claim 1, wherein the ferroelectric dielectric layer includes $HfZrO_2$.

8. The negative capacitance structure of claim 1, wherein the second conductive layer includes TiN or TiN doped with Si.

9. A negative capacitance field effect transistor (NC-FET), comprising:
   a channel layer made of a semiconductor;
   a ferroelectric dielectric layer disposed over the channel layer; and
   a gate electrode layer disposed over the ferroelectric dielectric layer,
   wherein the ferroelectric dielectric layer includes an orthorhombic crystal phase and at least one of a monolithic phase or a tetragonal phase, and the orthorhombic crystal phase is at least 80% of the ferroelectric layer.

10. The NC-FET of claim 9, wherein the ferroelectric dielectric layer includes HfO$_2$ doped with one or more selected from the group consisting of Si, Zr, Al, La, Y, Gd and Sr.

11. The NC-FET of claim 9, wherein the ferroelectric dielectric layer includes HfO$_2$ doped with at least one selected from the group consisting of Si and Zr.

12. The NC-FET of claim 11, wherein:
the gate electrode layer includes a first conductive layer disposed on the ferroelectric dielectric layer, and
the first conductive layer is made of TiN or TiN doped with one or more elements.

13. The NC-FET of claim 12, wherein:
the gate electrode layer further includes a second conductive layer disposed on the first conductive layer, and
the second conductive layer is made of TaN.

14. The NC-FET of claim 13, wherein:
the gate electrode layer further includes a work function adjustment layer disposed on the second conductive layer, and a tungsten layer disposed over the work function adjustment layer.

15. The NC-FET of claim 14, wherein the NC-FET is a p-type FET and the work function adjustment layer includes TiN.

16. A negative capacitance field effect transistor (NC-FET), comprising:
a fin structure having a channel layer made of a semiconductor, the channel layer protruding from an isolation insulating layer;
a first dielectric layer disposed over the channel layer;
a ferroelectric dielectric layer disposed over the first dielectric layer;
a gate electrode layer disposed over the ferroelectric dielectric layer; and
gate sidewall spacers,
wherein the ferroelectric dielectric layer includes HfO$_2$ including an orthorhombic crystal phase, disposed on the first dielectric layer, and the isolation insulating layer, and
the ferroelectric dielectric layer further includes at least one of a monolithic phase or a tetragonal phase and the orthorhombic crystal phase is at least 80% of the ferroelectric layer.

* * * * *